(12) United States Patent  
Campbell et al.

(10) Patent No.: US 9,404,940 B1  
(45) Date of Patent: *Aug. 2, 2016

(54) COMPENSATING PROBING TIP OPTIMIZED ADAPTERS FOR USE WITH SPECIFIC ELECTRICAL TEST PROBES

(71) Applicant: Teledyne LeCroy, Inc., Thousand Oaks, CA (US)

(72) Inventors: Julie A. Campbell, Beaverton, OR (US); Lenny Rayzman, Santa Clara, CA (US); Albert Sutono, San Jose, CA (US)

(73) Assignee: TELEDYNE LECROY, INC., Thousand Oaks, CA (US)

( * ) Notice: Subject to any disclaimer, the term of this patent is extended or adjusted under 35 U.S.C. 154(b) by 433 days.

This patent is subject to a terminal disclaimer.

(21) Appl. No.: 13/783,298

(22) Filed: Mar. 3, 2013

Related U.S. Application Data

(63) Continuation-in-part of application No. 13/292,072, filed on Nov. 8, 2011, now Pat. No. 9,140,724, which is a continuation-in-part of application No. 12/715,269, filed on Mar. 1, 2010, now Pat. No. 8,098,078, which is a continuation of application No. 11/650,368, filed on Jan. 5, 2007, now Pat. No. 7,671,613.

(60) Provisional application No. 61/437,635, filed on Jan. 29, 2011, provisional application No. 60/757,077, filed on Jan. 6, 2006.

(51) Int. Cl.  
*G01R 31/20* (2006.01)  
*G01R 1/067* (2006.01)

(52) U.S. Cl.  
CPC ..................................... *G01R 1/067* (2013.01)

(58) Field of Classification Search  
None  
See application file for complete search history.

(56) References Cited

U.S. PATENT DOCUMENTS

| 3,072,877 A | 1/1963 | Landwehr |
| 3,676,776 A | 7/1972 | Bauer et al. |
| 3,885,848 A | 5/1975 | Brouneus |
| 4,491,788 A | 1/1985 | Zandonatti |
| 4,552,465 A | 11/1985 | Anderson |
| 4,740,746 A | 4/1988 | Pollock et al. |

(Continued)

FOREIGN PATENT DOCUMENTS

| JP | 01270391 | 10/1989 |
| JP | 04086009 | 3/1992 |

OTHER PUBLICATIONS

Tektronix, P6248 1.7 GHz (Typical) Differential Probe Instructions, 071-0566-01, as least as early as Jan. 25, 2011, pp. 4 and 5.

(Continued)

*Primary Examiner* — Paresh Patel  
(74) *Attorney, Agent, or Firm* — Law Office of Karen Dana Oster, LLC

(57) ABSTRACT

An adapter as disclosed herein includes at least one transmission path providing an electrical connection between the probing end and the head connection end. The adapter includes a flexible tab-board adapter associated with the probing end of the transmission path, the flexible tab-board adapter for contacting at least one signal testing point. The adapter may further include at least one compensating network positioned substantially near the probing end, the at least one compensating network configured to compensate for parasitics of the adapter.

11 Claims, 24 Drawing Sheets

(56) References Cited

U.S. PATENT DOCUMENTS

| | | | |
|---|---|---|---|
| 4,773,877 A | 9/1988 | Kruger et al. |
| 4,923,407 A | 5/1990 | Rice et al. |
| 4,978,312 A | 12/1990 | Fodali |
| 5,032,787 A | 7/1991 | Johnston et al. |
| 5,151,040 A | 9/1992 | Tanaka |
| 5,173,058 A | 12/1992 | Broeksteeg et al. |
| 5,223,787 A | 6/1993 | Smith et al. |
| 5,549,479 A | 8/1996 | Elco et al. |
| 5,795,171 A | 8/1998 | Bernardini |
| 5,846,097 A | 12/1998 | Marian, Jr. |
| 5,914,612 A | 6/1999 | Koken et al. |
| 5,939,890 A | 8/1999 | Kohen et al. |
| 5,967,856 A | 10/1999 | Meller |
| 5,982,187 A | 11/1999 | Tarzwell |
| 5,997,360 A | 12/1999 | Gen-Kuong et al. |
| 6,042,410 A | 3/2000 | Watanabe |
| 6,083,059 A | 7/2000 | Kuan |
| 6,089,896 A | 7/2000 | Kosmala |
| 6,137,302 A | 10/2000 | Schwindt |
| 6,191,594 B1 | 2/2001 | Nightingale et al. |
| D444,401 S | 7/2001 | Campbell |
| D444,720 S | 7/2001 | Campbell |
| 6,271,673 B1 | 8/2001 | Furuta et al. |
| 6,276,956 B1 | 8/2001 | Cook |
| 6,292,701 B1 | 9/2001 | Prass et al. |
| 6,363,605 B1 | 4/2002 | Shih et al. |
| 6,371,781 B1 | 4/2002 | Jones et al. |
| 6,400,167 B1 | 6/2002 | Gessford et al. |
| 6,404,215 B1 | 6/2002 | Nightingale et al. |
| 6,447,343 B1 | 9/2002 | Zhang et al. |
| 6,462,529 B1 | 10/2002 | Campbell |
| 6,464,511 B1 | 10/2002 | Watanabe et al. |
| 6,518,780 B1 | 2/2003 | Campbell et al. |
| 6,533,606 B2 | 3/2003 | Yamane |
| 6,538,424 B1 | 3/2003 | Campbell |
| 6,603,297 B1 | 8/2003 | Gessford et al. |
| 6,617,864 B2 | 9/2003 | Inoue et al. |
| 6,630,833 B2 | 10/2003 | Scott |
| 6,650,131 B2 | 11/2003 | Campbell et al. |
| 6,704,670 B2 | 3/2004 | McTigue |
| 6,791,345 B2 | 9/2004 | Maruyama et al. |
| 6,809,535 B2 | 10/2004 | Campbell |
| 6,828,768 B2 | 12/2004 | McTigue |
| 6,863,576 B2 | 3/2005 | Campbell et al. |
| 6,967,473 B1 | 11/2005 | Reed et al. |
| 7,019,544 B1 | 3/2006 | Jacobs et al. |
| 7,056,134 B2 | 6/2006 | Martin et al. |
| 7,091,730 B1 | 8/2006 | Parshotam et al. |
| 7,138,810 B2 | 11/2006 | Lesher et al. |
| 7,140,105 B2 | 11/2006 | Campbell |
| 7,167,011 B2 | 1/2007 | Yang |
| 7,242,173 B2 | 7/2007 | Cavoretto |
| 7,262,614 B1 | 8/2007 | Campbell |
| 7,294,995 B1 | 11/2007 | Stevens et al. |
| 7,371,093 B1 | 5/2008 | Johnson |
| 7,432,698 B1 | 10/2008 | Campbell et al. |
| 7,436,191 B2 | 10/2008 | Yang |
| 7,560,944 B2 | 7/2009 | Yang |
| 7,586,318 B2 | 9/2009 | Yang |
| 7,592,822 B2 | 9/2009 | Reed et al. |
| 7,671,613 B1 | 3/2010 | Campbell |
| 7,759,953 B2 * | 7/2010 | Strid .................. G01R 1/06772 324/762.05 |
| 7,777,509 B2 | 8/2010 | Halter et al. |
| 7,888,956 B2 | 2/2011 | Lee et al. |
| 8,098,078 B1 | 1/2012 | Campbell |
| 2004/0066181 A1 | 4/2004 | Thies |
| 2004/0207417 A1 | 10/2004 | Barr |

OTHER PUBLICATIONS

Tektronix, P6248 1.7 GHz (Typical) Differential Probe Service Manual, 071-0566-03, as least as early as Jan. 29, 2011, pp. 33 and 34.
Tektronix, P6248 1.7 GHz (Typical) Differential Instructions, 071-0566-03, as least as early as Jan. 29, 2011, pp. 1-7.

* cited by examiner

COMPENSATING PROBING TIP OPTIMIZED ADAPTERS FOR USE WITH SPECIFIC ELECTRICAL TEST PROBES The present application is a continuation-in-part of U.S. patent application Ser. No. 13/292,072, filed Nov. 8, 2011. U.S. patent application Ser. No. 13/292,072 is an application claiming the benefit under 35 USC Section 119(e) of U.S. Provisional Application Ser. No. 61/437,635, filed Jan. 29, 2011. U.S. patent application Ser. No. 13/292,072 is also a continuation-in-part of U.S. patent application Ser. No. 12/715,269, filed Mar. 1, 2010, now U.S. Pat. No. 8,098,078. U.S. patent application Ser. No. 12/715,269 is a continuation of U.S. patent application Ser. No. 11/650,368, filed Jan. 5, 2007, now U.S. Pat. No. 7,671,613. U.S. patent application Ser. No. 11/650,368 is an application claiming the benefit under 35 USC Section 119(e) of U.S. Provisional Patent Application Ser. No. 60/757,077, filed Jan. 6, 2006. The present application is based on and claims priority from these applications, the disclosures of which are hereby expressly incorporated herein by reference.

BACKGROUND OF INVENTION

Disclosed herein are compensating "probing tip" (electrical test probe tip) optimized adapters, and more particularly to compensating electrical test probe tip optimized adapters having a compensating network in series or parallel with the transmission path, the compensating probing tip adapters being optimized for use with specific electrical test probes.

A probing system generally includes an electrical test probe for providing an electrical connection between signal testing points of electrical components (e.g. integrated circuits) and testing instruments (e.g. oscilloscopes and other measuring, monitoring, diagnostic, and signal processing instruments). An electrical test probe generally includes a cable (or other transmission path) having a probing head at one end and a testing instrument connector at the other end. The probing head (via at least one probing tip) is for interacting with electrical components. The testing instrument connector is for attaching the cable to testing instruments.

The probing head generally is interconnectable with at least one "probing tip" (electrical test probe tip), which may be an integral probing tip, a removable probing tip, and/or a replaceable probing tip. A socket, spring contact, or other connection means may be used for connecting a removable and/or replaceable probing tip to the probing head. Many probing heads have mechanisms for connecting two probing tips (one of which may be for probing ground). Probing heads may have mechanisms for connecting to more than two probing tips.

Users purchase the electrical test probes based on the performance of the electrical test probes. Accordingly, electrical test probes are carefully designed and tested. Representations and warranties as to the performance of the electrical test probes are made by manufacturers and vendors. These representations and warranties are based on how the electrical test probe performs up to a particular mechanical point of contact (a minimal configuration). No representations or warranties are made to the performance of the electrical test probes beyond that particular mechanical point of contact.

Probing tips may be used, for example, for making electrical contact with signal testing points (e.g. components through which an electrical signal is flowing, such as legs of an IC (integrated circuit), pins, leads, paths, or other electrical components) such as those found on a circuit board or other device under test (DUT). Signals may flow from the testing points through a transmission or input path (that extends substantially the length of the probing tip), through the probing head, through the cable, and to the testing instrument.

Probing tips may connect the probing head to signal testing points (also called probing points). Probing tips may also be used to connect the probing head to ground (a special type of probing point). Ground provides the electrical reference point for other signal measurements. In other words, the ground connection typically remains unchanged while the probing head is positioned at (or otherwise interacts with) other signal testing points, so that the electrical signal thereon may be measured, monitored, or otherwise processed. A user may use multiple probing tips for connecting to multiple signal testing points. For example, a user might want to connect to multiple signal testing points to compare signals thereon or to perform operations on signals thereon (e.g. summing operations, differential operations, or quantifying operations). Alternatively, a user may use one probing tip to connect to ground and another probing tip to connect to a signal testing point having an electrical signal thereon.

It is difficult to form a contact with modern miniaturized testing points. For example, both the pins and the spacing between the pins on a modern integrated circuit chip ("IC") have been miniaturized. When probing for electrical signals in tight spaces, engineers may need to connect two signal testing points simultaneously. This need may arise, for example, as a need to simultaneously connect to a signal testing point and a ground testing point. This need may also arise as a need to connect two signal lines (testing points) in a differential probing setting in an integrated circuit. Tight spaces other than those associated with an integrated circuit might also need to be probed. If two adjacent pins are contacted simultaneously by the probing tip, a short circuit may result between the two adjacent pins. A short circuit may prevent measurement of the desired signal and/or may result in damage to the internal circuitry of the integrated circuit.

In the integrated circuit context, both the signal probing tip and the ground probing tip need to be connected through the legs of the integrated circuit. The distances between the ground testing point and leg testing point to be probed, however, may be variable distances apart, and indeed may change as the desired leg to be probed changes. Thus, a user probing such an integrated circuit needs a flexible multi-spacing method that isolates one leg of such an integrated circuit. This one leg may be a ground leg or a signal leg. Importantly, when making contact with the legs of the integrated circuit, the probing tips must be electrically isolated from any other integrated circuit legs. If inadvertent electrical contact is made with another leg, a short circuit may result, or an improper reading is possible.

Many solutions to the variable distance problem require a plurality of adapters, each adapter designed for a different distance between integrated circuit legs being probed. This multiple adapter type of solution requires the user to carry extra adapters that can be easily lost. This type of solution also requires the user to remove and replace the adapters which is time consuming and troublesome. This multiple adapter type of solution can also mean that the user does not have the proper adapter. In short, this multiple adapter type of solution is fraught with problems.

BRIEF SUMMARY OF THE INVENTION

Disclosed herein is a probing tip or conductive connector that is referred to generally as a "probing blade." Also disclosed herein are compensating probing tip optimized adapters that are generally referred to as "compensating adapters."

The disclosed probing blade is suitable for performing desired probing activities. For example, the probing blade of the present invention can be used to provide a stable ground for high frequency probing and integrated circuit leg probing. The probing blade can be used to connect with many different integrated circuit leg pitches and to span one to more than twenty integrated circuit legs.

A probing blade conductive connector of the present invention includes a flexible-deflectable extension having a probing end and a head connection end. A conductive transmission path extends between the probing end and the head connection end. A pogo-rotational-action pin is electrically connected to the transmission path at the head connection end of the flexible-deflectable extension. Preferably, the flexible-deflectable extension is flexibly-deflectably adjustable. Preferably, the pogo-rotational-action pin provides both longitudinal motion (LM) and rotational movement (RM) between the flexible-deflectable extension and a probing head.

In one preferred embodiment, the flexible-deflectable extension has a front surface (through which at least a portion of the transmission path is exposed and/or accessible) and a back surface that is electrically insulated.

In one preferred embodiment, the flexible-deflectable extension further includes a support layer and a covering layer. The transmission path is positioned between the support layer and the covering layer.

In one preferred embodiment, solder is associated with the transmission path at the probing end of the flexible-deflectable extension.

In one preferred embodiment, the pogo-rotational-action pin is interconnectable with a connection mechanism of a probing head of an electrical test probe.

A compensating adapter described herein is used with an electrical test probe having a mechanical point of contact, the conductive connector adapter spanning the distance between the mechanical point of contact and at least one signal testing point. The compensating adapter has at least one transmission path extending longitudinally therewith. Each transmission path has a probing end and a head connection end. At least one compensating network is positioned substantially near the probing end of the at least one transmission path, the at least one compensating network configured with (e.g. in parallel or in serial) the at least one transmission path. For preferred compensating adapters, the at least one compensating network compensates for inductance caused by the conductive connector adapter. For preferred compensating adapters, the at least one compensating network when used in combination with the electrical test probe is optimized to the signal testing point.

Exemplary preferred compensating adapters include a probing blade adapter, a twisted pair adapter, a Y-lead adapter, a swivel pogo tip pair adapter, and a flexible tab-board adapter.

The at least one compensating network may include components such as at least one resister, at least one capacitor, a circuit, and/or a combination of the other components.

Disclosed herein is an adapter may have a probing end and a head connection end. The head connection end of the adapter is for associating with a probing head of an electrical test probe and the probing end of the adapter for contacting at least one signal testing point. The adapter includes: (a) at least one transmission path providing an electrical connection between the probing end and the head connection end; and (b) a flexible tab-board adapter associated with the probing end of the transmission path, the flexible tab-board adapter for contacting at least one signal testing point.

The adapter may further include at least one compensating network positioned substantially near the probing end, the at least one compensating network configured to compensate for parasitics of the adapter.

The flexible tab-board adapter may have at least one flex and an associated at least one tab. Each at least one flex allowing flexibility between its associated tab and the rest of the flexible tab-board adapter.

The flexible tab-board adapter may have at least one flex and an associated at least one tab. Each at least one flex allowing flexibility between its associated tab and the rest of the flexible tab-board adapter. Each at least one tab may have at least part of at least one compensating network associated therewith.

The flexible tab-board adapter may have at least one flex having a first flex end and a second flex end. The flexible tab-board adapter may have at least one tab associated with the first flex end. Each at least one flex allowing flexibility between its associated tab and the rest of the flexible tab-board adapter. At least part of at least one compensating network may be associated with the at least one tab at the first flex end. At least part of the at least one compensating network may be associated with the rest of the flexible tab-board adapter associated with the second flex end.

The flexible tab-board adapter is preferably removable and replaceable.

The adapter may further include a flexible transmission line extension associated with the at least one transmission path. The flexible tab-board adapter is preferably associatable with the flexible transmission line extension using a module-extension connector.

The adapter may further include a flexible transmission line extension associated with the at least one transmission path. The adapter may further include a module-extension connector. The module-extension connector may have a first component associated with the flexible tab-board adapter and a second component associated with the flexible transmission line extension. The first component and second component of the module-extension connector are preferably engageable and disengageable.

The flexible tab-board adapter may be a variation of a flexible tab-board adapter selected from the group consisting of: (a) a wire-tipped flexible tab-board adapter; (b) a solderable flexible tab-board adapter; (c) a conductor-covered flexible tab-board adapter; (d) a socketed flexible tab-board adapter; (e) an alternative conductor flexible tab-board adapter; (f) an alternative shaped flexible tab-board adapter; and (g) an adapter being a combination of the variations listed in (a)-(f).

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
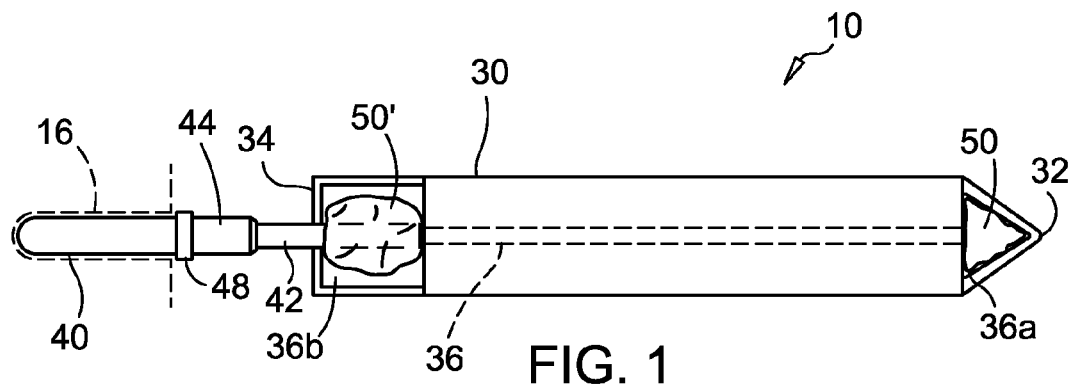
FIG. 1 is a front plan view of a first exemplary embodiment of a probing blade of the present invention having solder on its probing end.

Disclosed herein is a probing tip or conductive connector that is referred to generally as a "probing blade" (as shown in FIGS. 1-15). Also disclosed herein are compensating probing tip optimized adapters that are generally referred to as "compensating adapters" (as shown in FIGS. 16-40).

Probing Blade

The present invention is directed to a probing tip or conductive connector that is referred to generally as a probing blade 10, exemplary embodiments of which are shown in detail in FIGS. 1-10. The probing blade 10 is particularly useful for use in one-handed probing of signal testing points 20 (also discussed as integrated circuit legs 20, legs L, or legs L1-Ln associated with at least one edge of an integrated circuit 22 having, for example, four edges).

As shown in FIGS. 11-15, when the probing blade 10 of the present invention is used in conjunction with a probing head 12 having at least one other probing tip 14 (which may be a probing blade 10), a user can make electrical contact with selective signal testing points 20 "regardless" of the distance therebetween (the maximum distance being limited only by the length of the probing blade 10). Further, a probing head 12 using the probing blade 10 of the present invention can be used between integrated circuit legs 20 "regardless" of any differences in pitch, size, quantity, or spacing of the integrated circuit legs 20 (the maximum distance being limited only by the length of the probing blade 10). This is accomplished without having to install an adapter (e.g. this term being used here is the common meaning of a "geometry adapter" or the meaning as defined herein of a "geometry adapter with electrical compensation"). In preferred embodiments of the present invention, the probing blade 10 does not add distance to the input path, and provides a very short ground path when used in conjunction with an electrical test probe.

A probing head 12, used in conjunction with a probing blade 10 and a probing tip 14, can be used between a first integrated circuit leg L that contains a signal of interest and a second integrated circuit leg L that contains a signal of interest. Then, without disconnecting the probing blade 10 from the first integrated circuit leg L, the probing head 12 may be rotated so that the probing tip 14 is rotated to a third integrated circuit leg L that contains a signal of interest. This is possible even if the third integrated circuit leg L is on the opposite side of the edge of the integrated circuit 22 from the second integrated circuit leg L. Depending on the length of the probing blade 10, the characteristics of the integrated circuit (e.g. pitch, size, quantity, and/or spacing), and the location of the circuit legs, the second and third circuit legs may be on the same edge, parallel (opposite) edges, or perpendicular (adjacent) edges.

The probing blade 10 may be used with an electrical test probe (FIG. 11) for providing an electrical connection between testing points 20 (one of which may be ground) and a testing instrument. An electrical test probe generally consists of a probing head 12 (that may include at least one socket 16 or other means for attaching to the probing blade 10), a cable 18 (FIG. 11), and a testing instrument connector. At least one integral, removable, and/or replaceable probing blade 10 may be used in connection with the probing head 12. A removable and/or replaceable probing blade 10 would be connected to the probing head 12 using a socket 16, leaf spring, or other connection mechanism. The probing head 12 preferably includes active circuits, or alternatively, may be a passive probing head 12.

One preferred embodiment of the probing blade 10 of the present invention includes a flexible-deflectable extension 30 and a pogo-rotational-action pin 40. The flexible-deflectable extension 30 is flexibly-deflectably adjustable to provide a selective distance between two probing tips (the tips of the probing blade 10 and the probing tip 14) to span, for example, a plurality of integrated circuit legs L or other distances. Preferably, the pogo-rotational-action pin 40 is interconnectable (matable or integral) with a probing head 12 and provides both longitudinal motion (LM) and rotational movement (RM) between the flexible-deflectable extension 30 and the probing head 12.

Flexible-Deflectable Extension

The flexible-deflectable extension 30 is flexibly-deflectably adjustable to provide a selective distance between two probing tips (the tips of the probing blade 10 and the probing tip 14) to span many integrated circuit legs L, or other distances. This flexible-deflectable adjustability is accomplished because the flexible-deflectable extension 30 is able to change shapes with a small amount of force and substantially holds or maintains the shape as long as the force is applied consistently. In preferred embodiments, the shape is incidental in that the shape is a result of the force applied to move the probing head 12 and not as a goal itself. Further, the flexible-deflectable extension 30 substantially returns to its original shape, rather than holding the new shape when the force is removed (i.e. it is not shape retainable). For purposes of this invention, the flexible-deflectable extension 30 is not "floppy" in that it is able to temporarily hold its shape while force is being applied. For purposes of this invention, the flexible-deflectable extension 30 is not stiff in that it is able to change shape easily. Preferably, the flexible-deflectable extension 30 is hand flexible-deflectable such that no special tools are required for flexing-deflecting it. (The amount of force necessary for flexing-deflecting the flexible-deflectable extension 30 would be appropriate for its intended use of one-handed operation of a probing tip for probing electronic probing points.) The flexible-deflectable extension 30 may be loosely characterized as a cantilever-spring.

A flexible-deflectable extension 30 of the present invention preferably includes a probing end 32 suitable for probing and a head connection end 34 that connects (shown as an indirect connection through the pogo-rotational-action pin 40) to a probing head 12. A transmission path 36 extends between the probing end 32 and the head connection end 34. The probing end 32 may be, for example, shaped so that it can be selectively pinned, secured, or otherwise tightly fit between integrated circuit legs L to make selective electrical contact with a desired one of a plurality of integrated circuit legs L. In some preferred embodiments (FIGS. 1, 4-6, and 10), solder 50 is positioned on the probing end 32 of the flexible-deflectable extension 30. The head connection end 34 preferably has an attached pogo-rotational-action pin 40 that may be attached by solder 50'.

Figure 10:
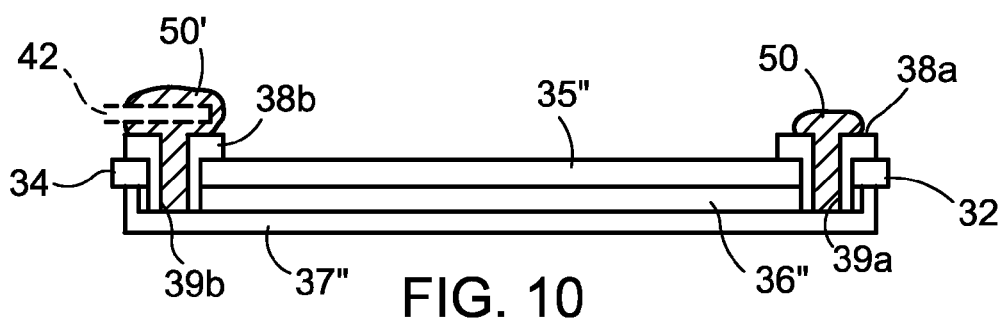
FIG. 10 is a cross-sectional side view of another alternative flexible-deflectable extension of FIG. 7 having solder on its probing end.

Significantly, only one surface (shown as a front surface) or face of the flexible-deflectable extension 30 allows for electrical access to the conductive transmission path 36. Preferably, the second, back (e.g. FIGS. 3 and 9), and/or other surface(s) are electrically insulated or covered such that the conductive transmission path 36 is not exposed. Electrical access may be accomplished, for example, by exposing at least part of the transmission path 36 as "pads" at either end. Electrical access may also be accomplished using alternative means such as through-holes. FIGS. 1-2 and 4-6 show one type of means for accessing the conductive transmission path 36 in which at least a portion of the conductive transmission path 36 is exposed on the surface. In this example, the front surface preferably has an exposed portion of the conductive transmission path 36 (e.g. "pad" 36a) at the probing end 32 and, in preferred embodiments, an exposed portion of the conductive transmission path 36 (e.g. "pad" 36b) at the head connection end 34. FIGS. 7 and 10 show another type of means for accessing the conductive transmission path 36 using through-holes 39a, 39b in "pads" 38a, 38b. The through-holes 39a, 39b preferably have an interior surface that is conducting or transmission enhancing. It should be noted that other types of electrical paths may allow electrical access from the front surface to the conductive transmission path 36.

Figure 2:
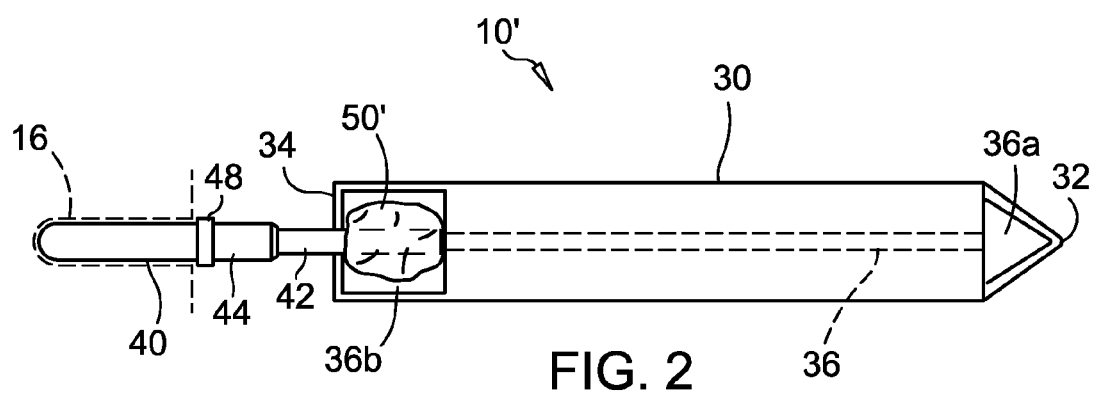
FIG. 2 is a front plan view of a second exemplary embodiment of a probing blade of the present invention without solder on its probing end.
Figure 3:
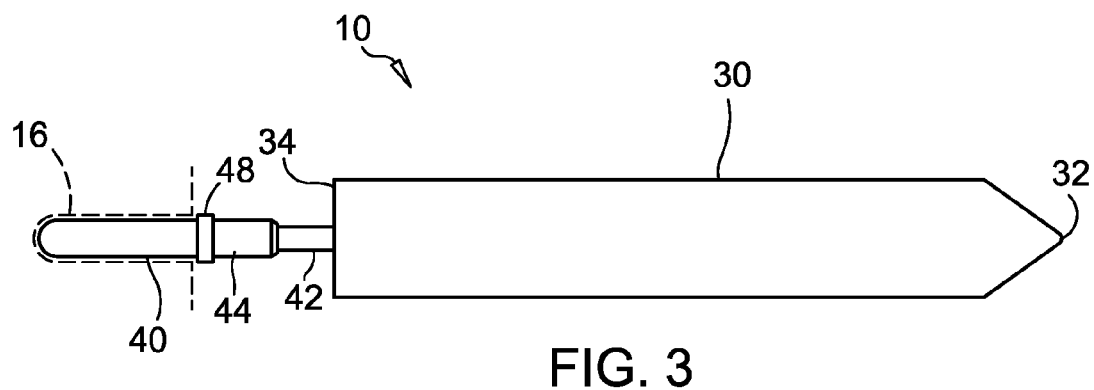
FIG. 3 is a back plan view of an exemplary embodiment of a probing blade of the present invention.

FIG. 1 shows the front surface of a first exemplary embodiment of a probing blade 10 of the present invention having solder 50 on its probing end 32. FIG. 2 shows the front surface of a second exemplary embodiment of a probing blade 10' of the present invention. The primary difference between the first embodiment probing blade 10 and the second embodiment probing blade 10' is that the first embodiment probing blade 10 has solder 50 on its probing end 32, whereas the second embodiment probing blade 10' does not. In both embodiments 10, 10' a transmission path 36 extends between the probing end 32 and the head connection end 34. It should be noted that the shown transmission path is meant to be exemplary and may have different characteristics (e.g. it may be wider or narrower than the path shown). FIG. 3 shows an exemplary back surface of either the first exemplary embodiment or the second exemplary embodiment.

Figure 4:
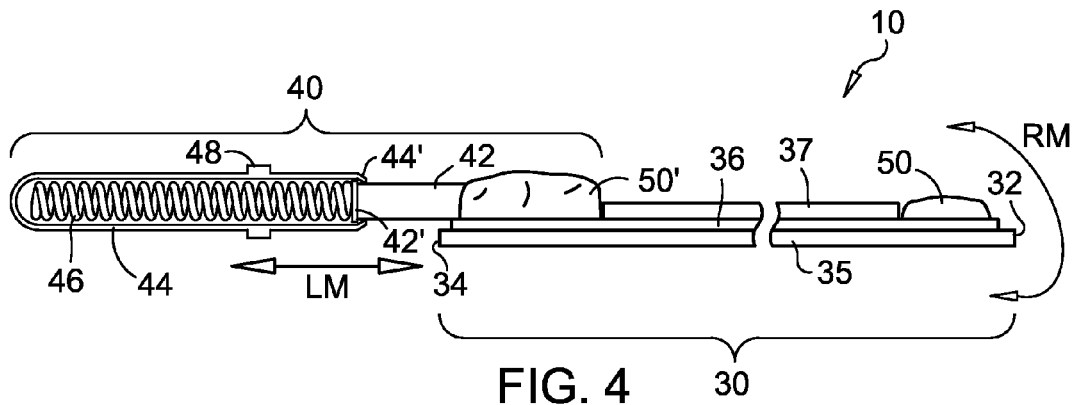
FIG. 4 is a partial side view of the first exemplary embodiment of a probing blade of the present invention, the pogo-rotational-action pin (shown in cross-section) being in an expanded state.
Figure 5:
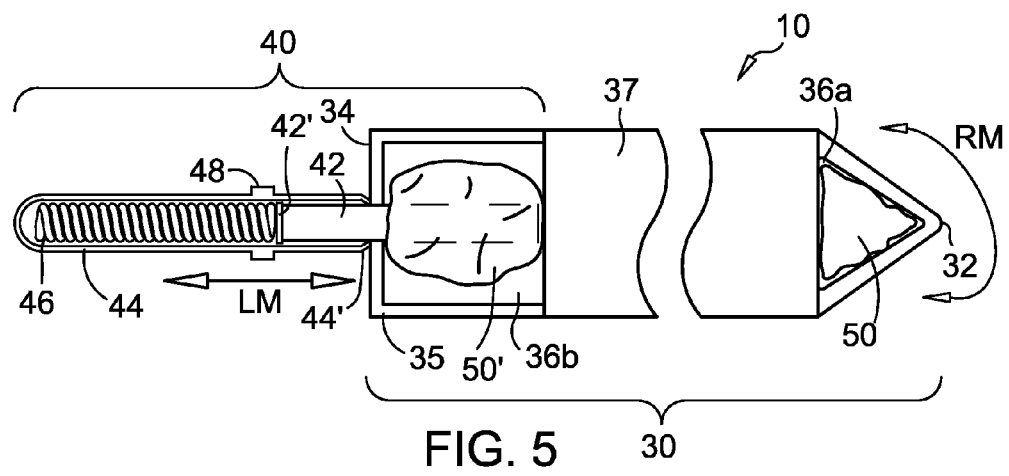
FIG. 5 is a partial front view of the first exemplary embodiment of a probing blade of the present invention, the pogo-rotational-action pin (shown in cross-section) being in a contracted state, and the flexible-deflectable extension being rotated 90° from the position of the flexible-deflectable extension shown in FIG. 4.

FIG. 4 shows an exemplary embodiment of the probing blade 10, 10' from the side. In this embodiment, the electrical or transmission path 36 (e.g. a conductive layer) is positioned between a support layer 35 (e.g. flex) and a covering layer 37 (e.g. a protective insulating layer). The layers (e.g. the transmission path 36, the support layer 35, and the covering layer 37) are preferably constructed as a flexible printed circuit board (PCB). The substantial "sandwiching" of the transmission path 36 between the non-conductive support layer 35 and the non-conductive covering layer 37 helps to prevent unwanted electrical contact with the transmission path 36. As shown in FIG. 5, the transmission path 36 may have an enlarged "pad" 36a at the probing end 32 and an enlarged "pad" 36b at the head connection end 34. The enlarged "pads" 36a, 36b facilitate better and/or easier connections. One example of this is that the inner member 42 of the pogo-rotational-action pin 40 can easily be soldered or electrically connected to the enlarged "pad" 36b at the head connection end 34. Another example of this is that the enlarged "pad" 36a at the probing end 32 makes it easy to connect to signal testing points 20.

Figure 7:
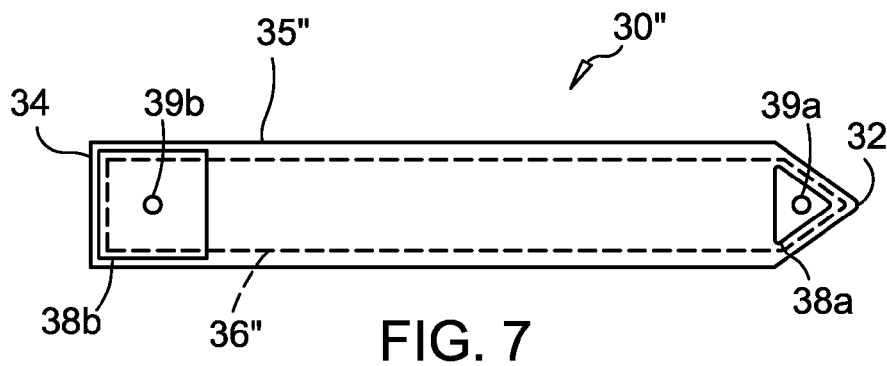
FIG. 7 is a front plan view of an alternative flexible-deflectable extension that could be used in a third exemplary embodiment of a probing blade of the present invention.
Figure 8:
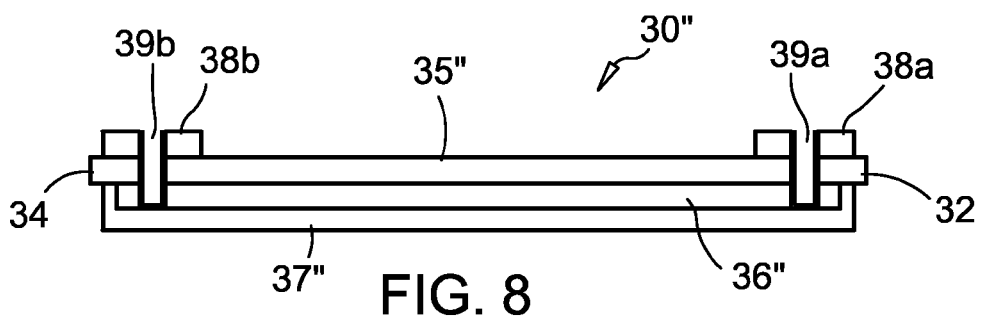
FIG. 8 is a cross-sectional side view of the alternative flexible-deflectable extension of FIG. 7.
Figure 9:
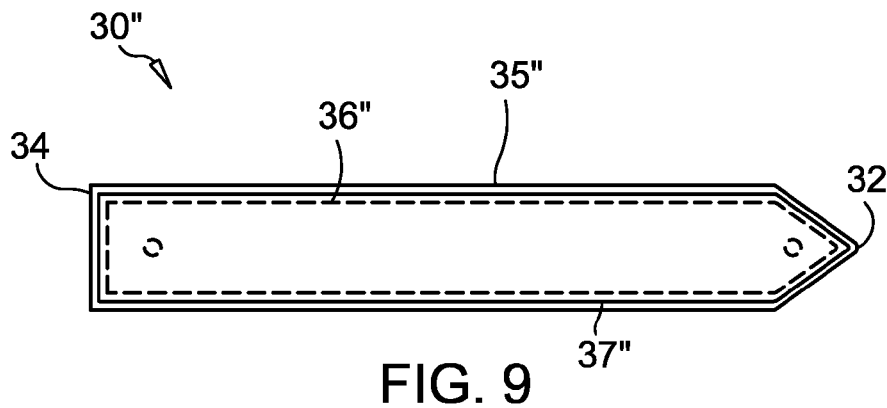
FIG. 9 is a back plan view of the alternative flexible-deflectable extension of FIG. 7.

FIGS. 7-10 show an alternative exemplary embodiment of a flexible-deflectable extension 30" for the probing blade. In this alternative embodiment, although the electrical or transmission path 36" (e.g. a conductive layer) is positioned between a support layer 35" (e.g. flex) and a covering layer 37" (e.g. a protective insulating layer), the positioning of these layers is different than the positioning of the layers shown in FIG. 4. Specifically, the support layer 35" is on the top and the covering layer 37" is on the bottom. The substantial "sandwiching" of the transmission path 36" between the non-conductive support layer 35" and the non-conductive covering layer 37" helps to prevent unwanted electrical contact with the transmission path 36". The layers (e.g. the transmission path 36", the support layer 35", and the covering layer 37") are preferably constructed as a flexible printed circuit board. In this embodiment, an enlarged "pad" 38a (at the probing end 32) and an enlarged "pad" 38b (at the head connection end 34) are added to the top surface of the support layer 35". The enlarged "pads" 38a, 38b have at least one through-hole 39a, 39b (or void) defined therein that extends through the support layer 35" and (optionally) through the transmission path 36". Alternatively, the through-hole 39a, 39b could abut transmission path 36" or extend through only a part of the transmission path 36". The through-holes 39a, 39b preferably have a conducting or transmission enhancing layer or coating (e.g. metals such as copper or gold) on the interior surface thereof. The enlarged "pads" 38a, 38b and conducting through-holes 39a, 39b allow signal transmission from the top surface of the probing end 32, through the transmission path 36", and to the head connection end 34. It should be noted that the enlarged "pads" 38a, 38b and conducting through-holes 39a, 39b may be formed by rivet-like devices, layers, coatings, and/or a combination thereof. For example, FIG. 8 shows the enlarged "pads" 38a, 38b as a layer and the through-holes 39a, 39b having a coating (shown as a thicker line) thereon that covers inner peripheral surfaces of the layers 38a, 38b, and 36. FIG. 10 shows the enlarged "pads" 38a, 38b and the through-holes 39a, 39b being created using a rivet-like device or a unified layer/coating (e.g. one layer or coating that is both on the top surface of the flexible-deflectable extension 30" and in the through-holes 39a, 39b). FIG. 10 also shows solder 50, 50' in the through-holes 39a, 39b.

As mentioned, the substantial "sandwiching" of the transmission path 36 between the non-conductive support layer 35 and the non-conductive covering layer 37 helps to prevent unwanted electrical contact with the transmission path 36. The "pads" and solder at the probing end 32 are only on one side/face of the probing blade 10. Because only one face of the probing end 32 is conductive, only one probing point 20 will be probed when the probing end 32 is positioned, for example, between two legs L. However, the user may rotate the flexible-deflectable extension 30 on the pogo-rotational-action pin 40 by 180° to probe either adjacent leg. In the preferred embodiment, the pogo-rotational-action pin 40 allows rotation in either direction in a 360° circle.

In preferred embodiments, the electrical or transmission path may be made of any conductive and flexible material. Exemplary preferred transmission path materials include copper or gold. In preferred embodiments, the support layer may be made of any "sturdy," non-conductive, and flexible material. Exemplary preferred support layer materials include kapton, polyimide, Rogers R-Flex® (Rogers Corporation, Advanced Circuit Materials Division, Chandler, Ariz.), or Pyralux® (DuPont, Wilmington, Del.). In preferred embodiments, the covering layer may be made of any insulating, non-conductive, and flexible material. Exemplary preferred covering layer materials include insulative kapton.

It should be noted that the proportions shown in the drawings are not drawn to scale. For example, the through-holes 39a, 39b may be significantly smaller in proportion to that shown in FIGS. 7-10. The "pads" of the various embodiments may be enlarged or of a smaller size. Another example is that the thickness of the layers in FIGS. 4, 8, and 10 may be significantly thicker than the shown preferred embodiments of the present invention. The thicknesses of the layers shown in the drawing have been exaggerated for purposes of drawing clarity. An exemplary preferred embodiment of the present invention would have a flexible-deflectable extension that is ⅜ inches-⅝ inches in length. This exemplary flexible-deflectable extension would be between 0.004 inches and 0.015 inches in thickness including the transmission path, the support layer, and the covering layer. These dimensions are meant to be exemplary and are not meant to limit the scope of the invention.

In the shown embodiments, the probing end 32 is a flat triangular-shaped tip. The flat triangular-shaped tip is able to hold a stable contact for integrated circuit legs L. As shown, the flat triangular-shaped tip has at least two equal sides (isosceles), but the sides could be uneven. Also, although the flat triangular-shaped tip is shown as having an angle of approximately 40°-70°, larger and smaller angles could be used. The probing end 32 may have a more conventional sharp-tip shape and not a specialty flat triangular-shaped tip. Other alternative shapes could be constructed such as the tips described in U.S. Pat. No. 6,538,424 (Notched Electrical Test Probe Tip), U.S. Pat. No. 6,809,535 (Notched Electrical Test Probe Tip), U.S. Pat. No. 7,140,105 (Notched Electrical Test Probe Tip), U.S. Pat. No. 6,650,131 (Electrical Test Probe Wedge Tip), U.S. Pat. No. 6,518,780 (Electrical Test Probe Wedge Tip), U.S. Pat. No. D444,720 (Notched Electrical Test Probe Tip), and U.S. Pat. No. D444,401 (Electrical Test Probe Wedge Tip). These patents/applications are assigned to the assignee of the present invention and their specifications are incorporated herein by reference. Still other preferred embodiments could be hybrids. For example, one or more sides of the flat triangular-shaped tip may have a notch defined therein. Another example of a hybrid is that the flat triangular-shaped tip may be relatively thick so that it can be tapered in one or more planes.

For higher bandwidth fidelity of the electrical test probe, the overall length of the flexible probing blade 10 could be shortened, or alternatively a compensating circuit could be added in series with a grounded (signal) path (transmission path 36). The thickness of the flexible-deflectable extension 30 could be increased. It should also be noted that any desired electrical test probe holder, including a human hand, will work with the probing blade 10 of the present invention.

Pogo-Rotational-Action Pin

The pogo-rotational-action pin 40 (also referred to herein as a "pogo pin 40") of the present invention is a spring-loaded pin that allows for two types of motion: longitudinal (LM) and rotational (RM). This may be accomplished using the structure shown in FIGS. 4 and 5 that includes an inner member 42 (shown as a shaft, plunger, or pin) that is slideable and rotatable within an outer member 44 (shown as a sleeve). A spring 46 provides an outward force tending to push the inner member 42 outward so that the pogo-rotational-action pin 40 is in an extended position as shown in FIG. 4. FIG. 5 shows the pogo-rotational-action pin 40 in a retracted position. The pogo-rotational-action pin 40 is attached to the transmission path 36 at one end (e.g. at the enlarged "pad" 36b at the head connection end 34 of the flexible-deflectable extension 30 via solder 50') and to a socket 16 of a probing head 12 at a second end (see FIGS. 1-3). In such a position, it is part of the electrical path that facilitates the transmission of signals between testing points 20 and a testing instrument.

As shown in FIGS. 4 and 5, the pogo-rotational-action pin 40 includes an inner member 42 that is slideable and rotatable within an outer member 44. In one preferred embodiment, the inner member 42 includes a conductive base or contactor 42' that extends at least partially beyond the annular edge of the end of the inner member 42. Preferably the contactor 42' is disk shaped and has a diameter slightly larger than the diameter of the inner member 42. In one preferred embodiment, the outer member 44 includes an inward lip 44' that bends at least partially inward towards the longitudinal center axis of the outer member 44. Preferably the inward lip 44' bends inwards annularly along the open end of the outer member 44 that receives the inner member 42. A spring 46 is positioned within the outer member 44. One end of the spring 46 butts against (so that it cannot go further, but is not necessarily secured to the outer member) the outer member 44 and the other end of the spring 46 butts against the end of the inner member 42 (contactor 42') positioned within the outer member 44. The spring 46 provides an outward force tending to push the inner member 42 outward so that the pogo-rotational-action pin 40 is in an extended position as shown in FIG. 4. In the shown embodiment, the extension position is limited by the contactor 42' coming into contact with the inward lip 44'. FIG. 5 shows the pogo-rotational-action pin 40 in a retracted position. The retracted position occurs when the outward force of the spring 46 is overcome by external force (e.g. the pogo pin 40 is being pushed inward) and the inner member 42 slides into the outer member 44 and the spring 46 compacts or compresses. It should be noted that the pogo-rotational-action pin 40 should be conductive to allow signals to flow therethrough.

Figure 12:
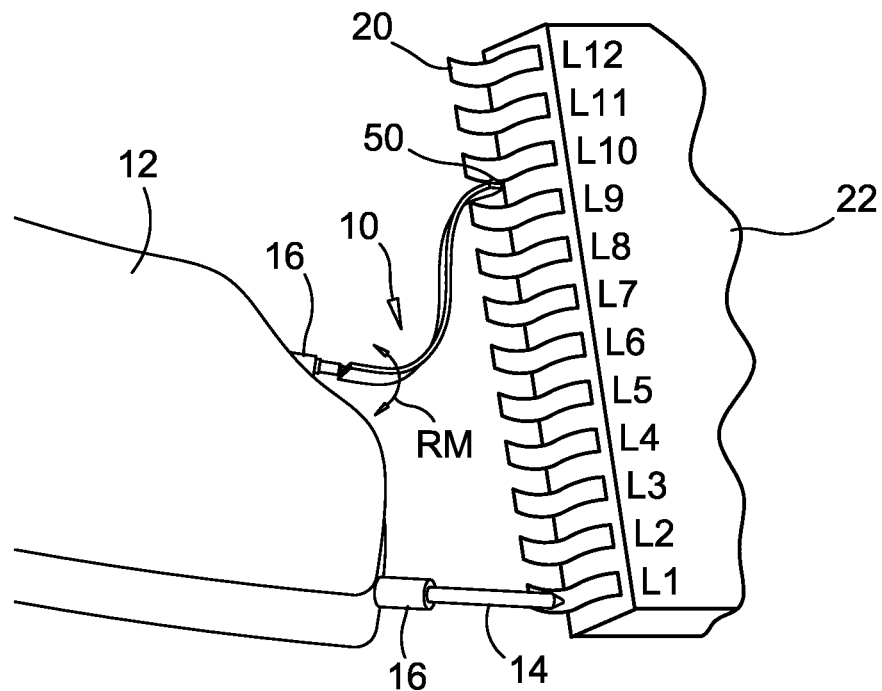
FIG. 12 is a perspective view of a probing blade of the present invention being used in a probing head to probe two signal testing points that are far apart (a far distance apart).
Figure 13:
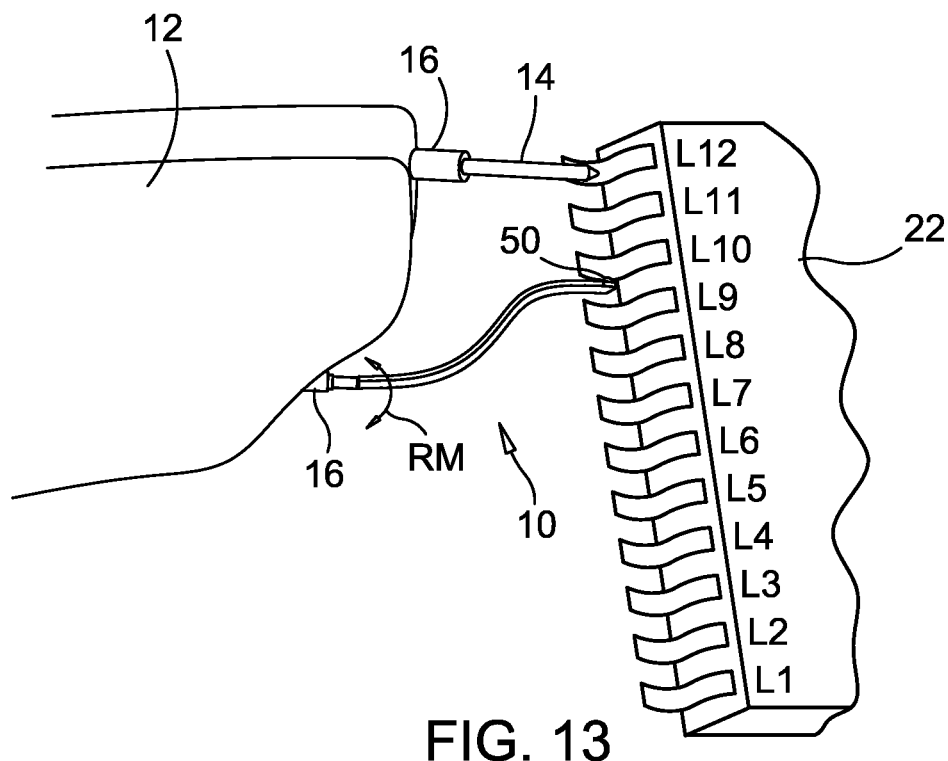
FIG. 13 is a perspective view of a probing blade of the present invention being used in a probing head to probe two signal testing points that are close together (a close distance apart).
Figure 14:
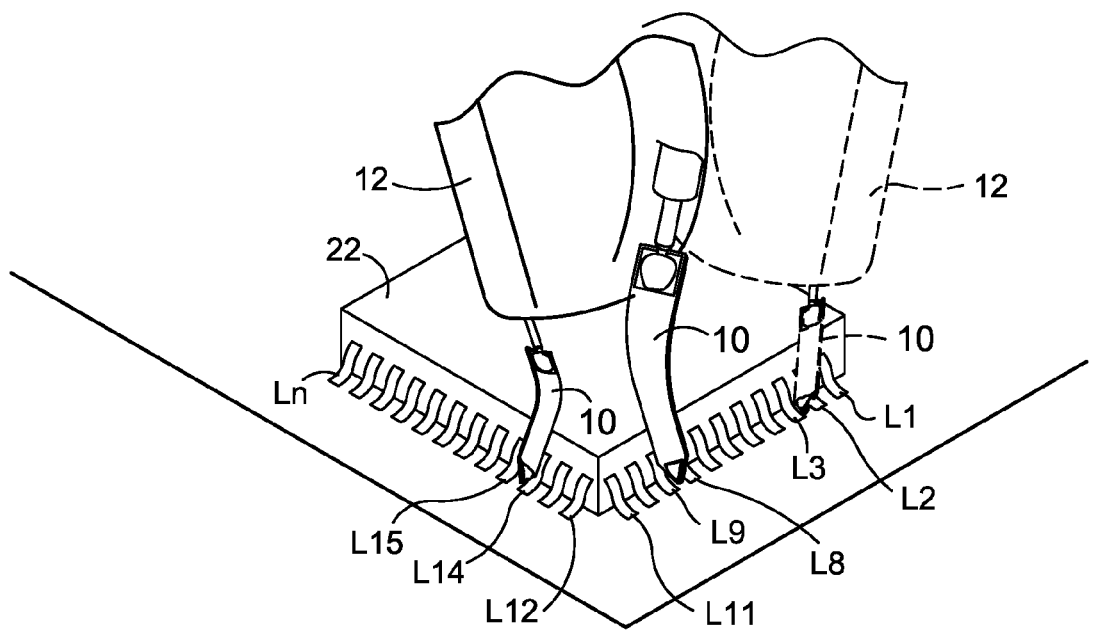
FIG. 14 is a perspective view of two probing blades of the present invention shown being used in a single probing head, the position of the probing head after rotational movement being shown in phantom.

The pogo-rotational-action pin 40 allows for two types of motion: longitudinal and rotational. The longitudinal motion (shown as dual directional arrow LM) is the traditional in/out motion of spring loaded pogo pins. The longitudinal motion is important because it provides a mechanism for variable force that translates to the probing end 32 that, in turn, interacts with the testing point with variable force. The rotational motion (shown as dual directional arrow RM) is important because it provides rotational positioning of the probing end 32. It is the rotational motion that allows a probing head 12 using the probing blade 10 to probe a first integrated circuit leg L and, without disconnecting, rotate between a second integrated circuit leg L on one side of the integrated circuit 22 and a third integrated circuit leg L on the opposite side of the first integrated circuit leg L. The two positions are shown in FIGS. 12 and 13. FIG. 14 shows the two positions on the same figure, one being in phantom.

Figure 6:
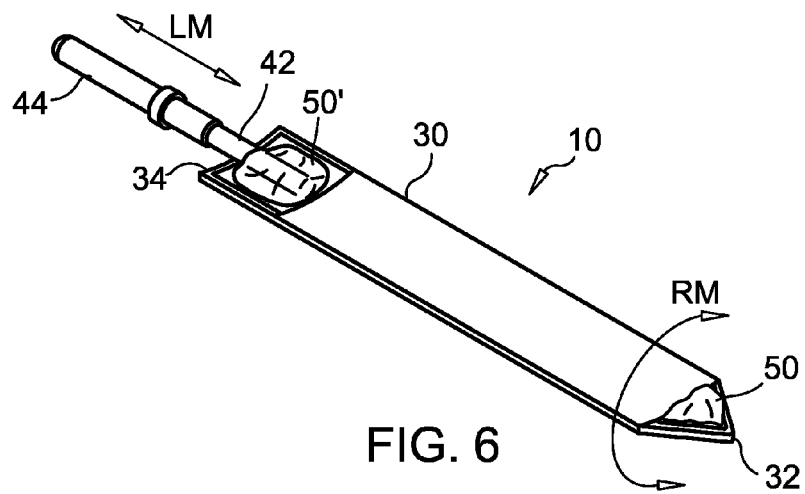
FIG. 6 is a perspective view of the exemplary embodiment shown in FIG. 1 showing rotational and linear movement.

FIGS. 4-6 show the longitudinal and rotational movement of a preferred exemplary embodiment of the pogo-rotational-action pin 40 in detail. FIG. 4 shows the pogo-rotational-action pin 40 in an expanded state and FIG. 5 shows the pogo-rotational-action pin 40 in a contracted state. The expanding and contracting of the pogo-rotational-action pin 40 is the longitudinal motion. FIG. 4 shows the flexible-deflectable extension 30 in first position and FIG. 5 shows the flexible-deflectable extension 30 in a second position, the second position being 90° from the first position. The pogo-rotational-action pin 40 allows for the rotational motion between the first position and the second position (or any other position in a 360° circle with the longitudinal axis of the pogo-rotational-action pin 40 being the center of the circle). It should be noted that the pogo-rotational-action pin 40 preferably can rotate 360° in its expanded state, its contracted state, and any state therebetween.

The pogo-rotational-action pin 40 may be integral or removable and/or replaceable. If the probing blade probing tip 10 is replaceable, generally the probing head 12 will have a socket 16 or other connection mechanism for mating with the probing blade 10. A shoulder/stop 48 may be provided on the annular exterior surface of the outer member 44 to provide an indication of a proper insertion depth of the pogo-rotational-action pin 40 within the socket 16. The shoulder/stop 48 may also be used as a grip for fingers, tweezers, and/or other tools.

Solder

Figure 15:
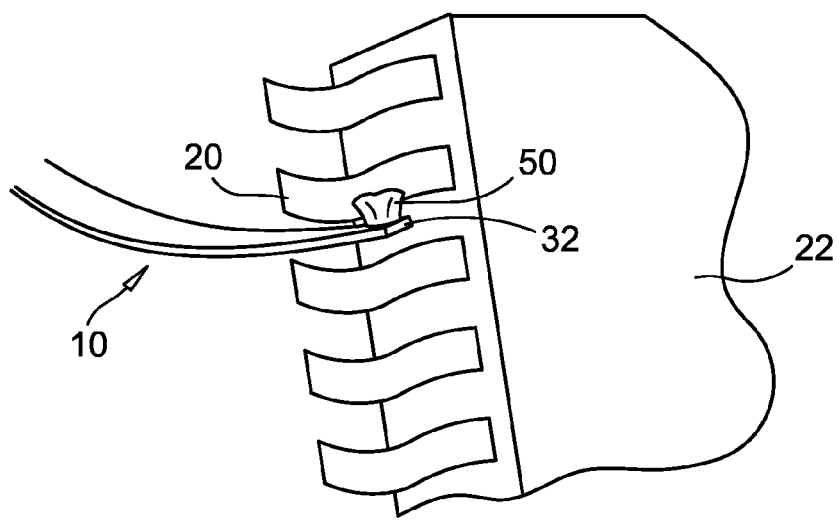
FIG. 15 is a perspective view of a probing end of a flexible-deflectable extension wedged between two integrated circuit legs, the solder being fused to the integrated circuit leg that is being probed.

Preferred exemplary embodiments of a probing blade 10 of the present invention may have solder 50 (shown as a solder bump) on its probing end 32. The solder 50 serves several purposes. First, the metal contact of the solder 50 may be pushed against an integrated circuit leg L or other testing point 20 having a signal of interest thereon. Second, the solder 50 may help prevent or reduce curling (e.g. the longitudinal edges of the flexible-deflectable extension 30 curling upwards and inwards) of the flexible-deflectable extension 30. FIG. 6 shows a slight curling that may be present even with the use of solder 50. Third, the solder 50 may act as a foot or other type of catch to help keep the probing end 32 properly wedged between two circuit legs L. Fourth, as shown in FIG. 15, it may be flowed (melted) to attach the probing end 32 to a circuit leg L to be probed.

It should be noted that the term "solder" is used in its general sense. Alternative electrical connection means including welding or silver epoxy may be used in place of the solder.

Probing Blade Examples

Figure 11:
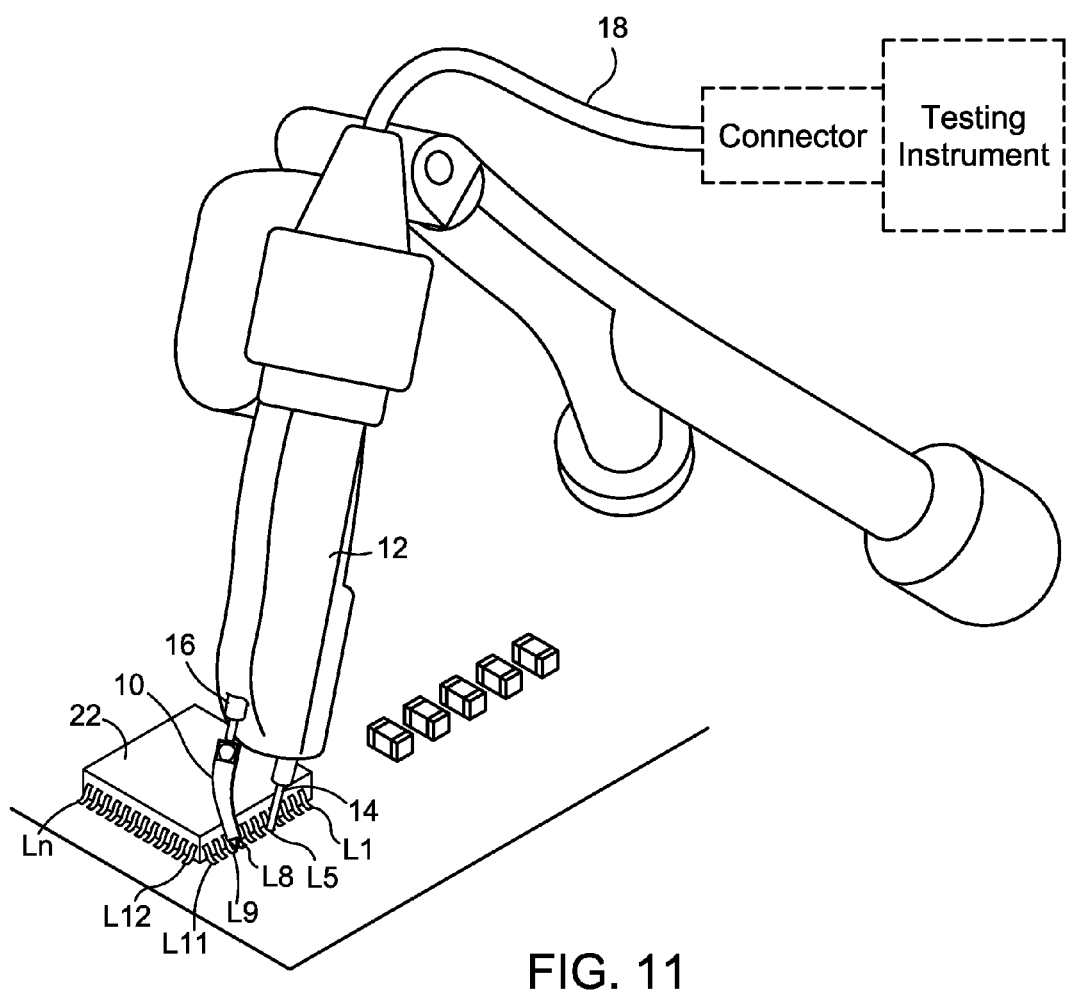
FIG. 11 is a perspective view of a probing blade of the present invention shown being used in a probing head supported by legs, the two signal testing points being a medium distance apart.

FIG. 11 shows a probing blade 10 of the present invention being used with a probing head 12 supported by legs for forming a tripod, the two signal testing points 20 being a medium distance apart. The legs may be those described in U.S. Pat. No. 6,462,529 (Legs For Forming A Tripod With An Electrical Test Probe), which is assigned to the assignee of the present invention and its specification is incorporated herein by reference. In this figure, the probing head 12 has both a probing blade 10 and a standard probing tip 14. The probing end 32 of the probing blade 10 is positioned between L8 and L9 and the second probing tip 14 is positioned on L5. Because only one face of the probing end 32 is conductive, only one probing point (L9) will be probed. The probing end 32 may include solder 50 that can be used to secure (for example, as a foot or soldered) the probing end 32 for probing. In this position, the pogo-rotational-action pin 40 has force being exerted on it so that the spring 46 is compressed and the pogo-rotational-action pin 40 is in a retracted position.

FIGS. 12 and 13 show a probing blade 10 of the present invention being used with a probing head 12 to probe two signal testing points 20 that are far apart (widely separated or a far distance apart) (FIG. 12) and two signal testing points 20 that are close together (a close distance apart) (FIG. 13). This shows the rotational motion (RM) feature of the present invention. In this embodiment, the probing end 32 of the probing blade 10 is positioned between L9 and L10. Because only one face of the probing end 32 is conductive, only one probing point (L10) will be probed. The probing end 32 may be soldered in place, hooked in place (using the solder as a foot), or held in place by friction (e.g. if the distance between legs is close). It is the rotational motion that allows a probing head 12 to use the second probing tip 14 to probe a first integrated circuit leg L1 (FIG. 12) and, without disconnecting, rotate so that the second probing tip 14 probes a second integrated circuit leg L12 (FIG. 13). In this example, L1 is on one side of the probing blade 10 (positioned between L9 and L10) and L12 is on the opposite side of the probing blade 10 (positioned between L9 and L10).

FIG. 14 shows a probing head 12 with two probing blades 10. This figure also shows two positions of the probing head 12 (one in phantom), again showing the rotational motion (RM) feature of the present invention. In this example, the probing head 12 is being used to probe two signal testing points 20 that are on opposite edges of an integrated circuit. As shown, the probing end 32 of the first probing blade 10 is positioned between L8 and L9. Because only one face of the probing end 32 is conductive, only one probing point (L9) will be probed. This probing end 32 may be soldered in place, hooked in place (using the solder as a foot), or held in place by friction (e.g. if the distance between legs is relatively small). In this figure, the second probing blade 10 probes a first integrated circuit leg L14 (solid) and, without disconnecting, rotates so that the second probing blade 10 probes a second integrated circuit leg L3 (in phantom). In this example, L14 is on one edge of the integrated circuit and L3 is on a different edge of the integrated circuit.

Method of Use of a Probing Blade

The present invention also includes a method for using the probing blade 10 of the present invention. In preferred embodiments of the method, the probing blade 10 is used in conjunction with a probing head 12 having at least one other probing tip 14 (that may be a probing blade 10). The probing head 12 can be used to make electrical contact with, for example, two signal testing points 20.

The first step of the method is to provide a probing blade 10 that has a flexible-deflectable extension 30 and a pogo-rotational-action pin 40. The flexible-deflectable extension 30 includes a probing end 32 (suitable for probing) and a head connection end 34 (suitable for connecting to a probing head 12—shown as an indirect connection through the pogo-rotational-action pin 40). FIGS. 1-10 show exemplary probing blades 10 in a substantially straight shape.

Next, as shown in FIGS. 11-15, a user positions the probing end 32 of a flexible-deflectable extension 30 between two integrated circuit legs L or other probing points 20. Alternatively, the probing end 32 may be positioned on top of, behind, against, hooked to, or otherwise in electrical contact with at least one probing point 20. If there is solder 50 on the probing end 32, it may then be flowed, melted, or otherwise electrically attached to the probing point 20 (as shown in FIG. 15).

The next step is to apply force to or otherwise create motion of the probing blade 10. The force may be rotational so as to create rotational motion (RM) so that a probing head 12 swivels in relation to the flexible-deflectable extension 30 using the pogo-rotational-action pin 40 as the pivot. The force may be longitudinal so as to create longitudinal motion (LM) so that the probing head 12 is pushed towards the probing point 20. A small amount of longitudinal force causes the pogo-rotational-action pin 40 to contract longitudinally (longitudinal motion (LM)) to create a better electrical connection. A larger amount of longitudinal force can cause the flexible-deflectable extension 30 to bend or bow. Force in other directions (e.g. diagonally, horizontally, rotationally) is absorbed by the bending of the flexible-deflectable extension 30. The force in other directions allows the probing head 12 to move in relation to the probing point 20. This would be important as the probing head 12 is moved so that the other probing tip 14 is used to probe a second probing point 20. Because the flexible-deflectable extension 30 is flexibly-deflectably adjustable, it is able to change shapes and hold the shape as long as the force remains, but substantially returns to its original shape, rather than holding the new shape when the force is removed.

A probing head 12, used in conjunction with a probing blade 10 and a probing tip 14, can be used between a first integrated circuit leg L that contains a signal of interest and a second integrated circuit leg L that contains a signal of interest. Then, without disconnecting the probing blade 10 from the first integrated circuit leg L, the probing head 12 may be rotated so that the probing tip 14 is rotated to a third integrated circuit leg L that contains a signal of interest. This is possible even if the third integrated circuit leg L is on the opposite side of the edge of the integrated circuit 22 from the second integrated circuit leg L. Depending on the length of the probing blade 10, the characteristics of the integrated circuit (e.g. pitch, size, quantity, and/or spacing), and the location of the circuit legs, the second and third circuit legs may be on the same edge, parallel (opposite) edges, or perpendicular (adjacent) edges.

Compensating Adapters

As set forth in the Background, users purchase electrical test probes based on the performance of the electrical test probes. Accordingly, electrical test probes are carefully designed and tested taking into consideration all the capacitance and resistance up to a mechanical point of contact (usually right near the amplifier). Representations and warranties as to the performance of the electrical test probes are made by manufacturers and vendors. These representations and warranties are based on how the electrical test probe performs up to particular mechanical point of contact (a minimal configuration) shown as a socket 16 or a point of contact 16' of a probing head 12. No representations or warranties are made to the performance of the electrical test probes beyond that particular mechanical point of contact. In particular, no representations or warranties are made to the performance of the electrical test probes used in conjunction with conductive connector accessories, some of which are supplied along with the electrical test probes. The accessories span the distance from the mechanical point of contact 16' to a signal testing point 20. With the lower bandwidths of older electrical test probes, accessories did not significantly affect the performance of the electrical test probes. But as newer electrical test probes have higher bandwidths, adding accessories to electrical test probes significantly affects the performance of the combination and the representations become grossly inaccurate. Using typical accessories with an electrical test probe has been shown to reduce certain specifications (e.g. amplitude) of the probe output by approximately 50%.

Disclosed herein are conductive connector accessories that will be referred to in general as compensating "probing tips" (electrical test probe tips) optimized adapters or, more succinctly, "compensating adapters" 100, 200, 300, 400, 500 (also referred to as "compensating resistance adapters," "compensating network adapters," or conductive connector adapters depending on the specific configuration and/or purpose). The compensating adapters have compensating resistance (or capacitance) that is configured with (in serial or parallel with) the transmission path that extends substantially longitudinally with (e.g. inside of or along the surface of) the compensating adapter. The resistance (or capacitance) is provided by resistance (or capacitance) devices referred to generally as "compensating networks" 112, 212, 312, 412, 512. The compensating networks may include components such as resisters, capacitors, circuits (including active circuitry, amplifiers, etc.), a combination of components, and/or other compensating means known or yet to be discovered. Each compensating adapter 100, 200, 300, 400, 500 has a probing end and a head connection end. The compensating networks 112, 212, 312, 412, 512 are preferably positioned substantially near (e.g. at or as near as possible to) the end of the compensating adapters 100, 200, 300, 400, 500 that is to contact the signal testing point 20 (the probing end). In this way, instead of only being optimized to the mechanical point of contact 16', the combination of the compensating adapter 100, 200, 300, 400, 500 and the electrical test probe is optimized for bandwidth performance all the way or substantially all the way to the signal testing point 20. Testing has shown that when a compensating adapter (such as one of those disclosed herein) replaces a structurally similar accessory in combination with an electrical test probe, the performance increases from peaking at 200 megahertz (with the typical accessory) to peaking at a gigahertz (with the compensating adapter). The result is that the accessories that have compensation will perform at significantly higher frequencies and have greatly increased probe loading capabilities as compared to accessories that do not have compensation.

Exactly which component(s) are in the compensating networks 112, 212, 312, 412, 512 is determined by the parasitics for which the compensating network is compensating. Parasitics include, but are not limited to, inductance, capacitance, and other losses. A primary consideration in selecting the component(s) in the compensating network the inductance caused by accessory (which will be affected by the length and materials of the accessory). A secondary consideration will be the electrical test probe itself. Preferred compensating adapters 100, 200, 300, 400, 500 will have compensating networks 112, 212, 312, 412, 512 that are optimized to compensate for use with specific types of electrical test probes (e.g. a particular manufacturer, model, and/or series). Other considerations include, but are not limited to, the intended device under test (DUT), the intended bandwidth, intended load, and other factors that can create inductance. Some alternative preferred compensating adapters 100, 200, 300, 400, 500 can be optimized to not only compensate for use with a specific type of electrical test probe, but are optimized individually to compensate for use with a specific electrical test probe. This individual optimization would generally be accomplished at the factory where the individual electrical test probe and the accessory (or accessories) can be optimized together. Some alternative preferred compensating adapters 100, 200, 300, 400, 500 can be adaptably optimized "in the field" by including changeable, tunable, and/or replaceable compensating networks 112, 212, 312, 412, 512.

Probing Blade Adapter

Figure 16:
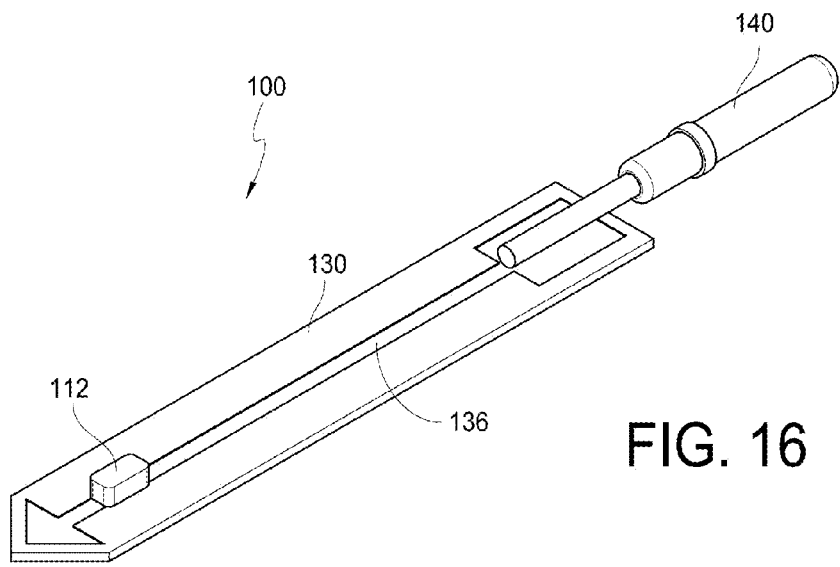
FIG. 16 is a perspective view of a first exemplary compensating electrical test probe tip optimized adapter in which the compensating network is configured with the transmission path of a probing blade adapter.
Figure 17:
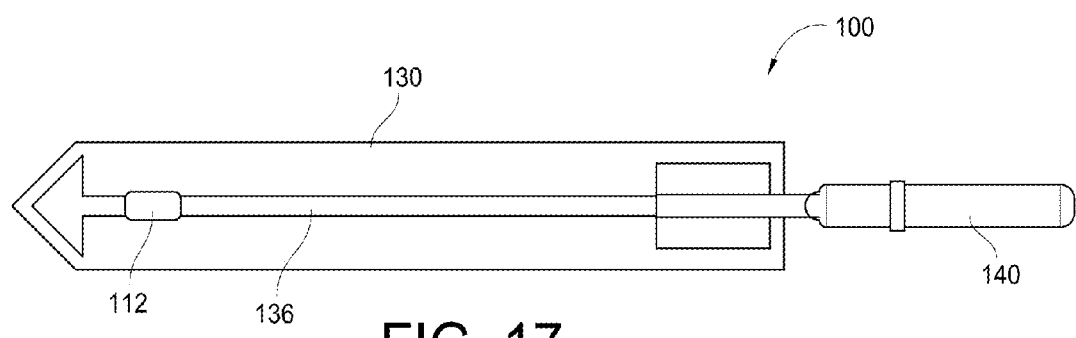
FIG. 17 is a front plan view of the first exemplary compensating electrical test probe tip optimized adapter.
Figure 18:
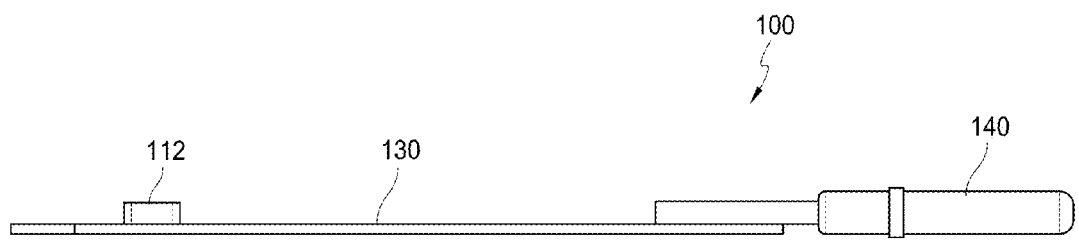
FIG. 18 is a side view of the first exemplary compensating electrical test probe tip optimized adapter.

As shown in FIGS. 16-18, the first exemplary compensating adapter is a probing blade adapter 100 that is particularly useful for connecting to and/or probing IC leads.

One preferred embodiment of the probing blade adapter 100 of the present invention includes a flexible-deflectable extension 130 (having a transmission path 136) and a pogo-rotational-action pin 140. The flexible-deflectable extension 130 is flexibly-deflectably adjustable to provide a selective distance between two probing tips. Preferably, the pogo-rotational-action pin 140 is interconnectable (matable or integral) with a probing head and provides both longitudinal motion (LM) and rotational movement (RM) between the flexible-deflectable extension 130 and the probing head. Additional features and/or information of preferred probing blade adapters 100 are incorporated herein from the description on the probing blade 10 described herein and in the applications from which this application claims priority.

The probing blade adapter 100, however, includes a compensating network 112 in serial or in parallel with the transmission path 136. The compensating network 112 is shown as a 20 ohm resistor ±1% that is soldered to the transmission path 136. The compensating network 112 may include components such as resisters, capacitors, circuits, a combination of components, and/or other compensating means known or yet to be discovered. The compensating network 112 is preferably positioned at (or as near as possible to) the end of the transmission path 136 of the probing blade adapter 100 that is to contact the signal testing point 20 (the probing end). In this way, instead of only being optimized to the mechanical point of contact 16', the combination of the probing blade adapter 100 and the electrical test probe is optimized for bandwidth performance all the way to the signal testing point 20.

Twisted Pair Adapter

Figure 19:
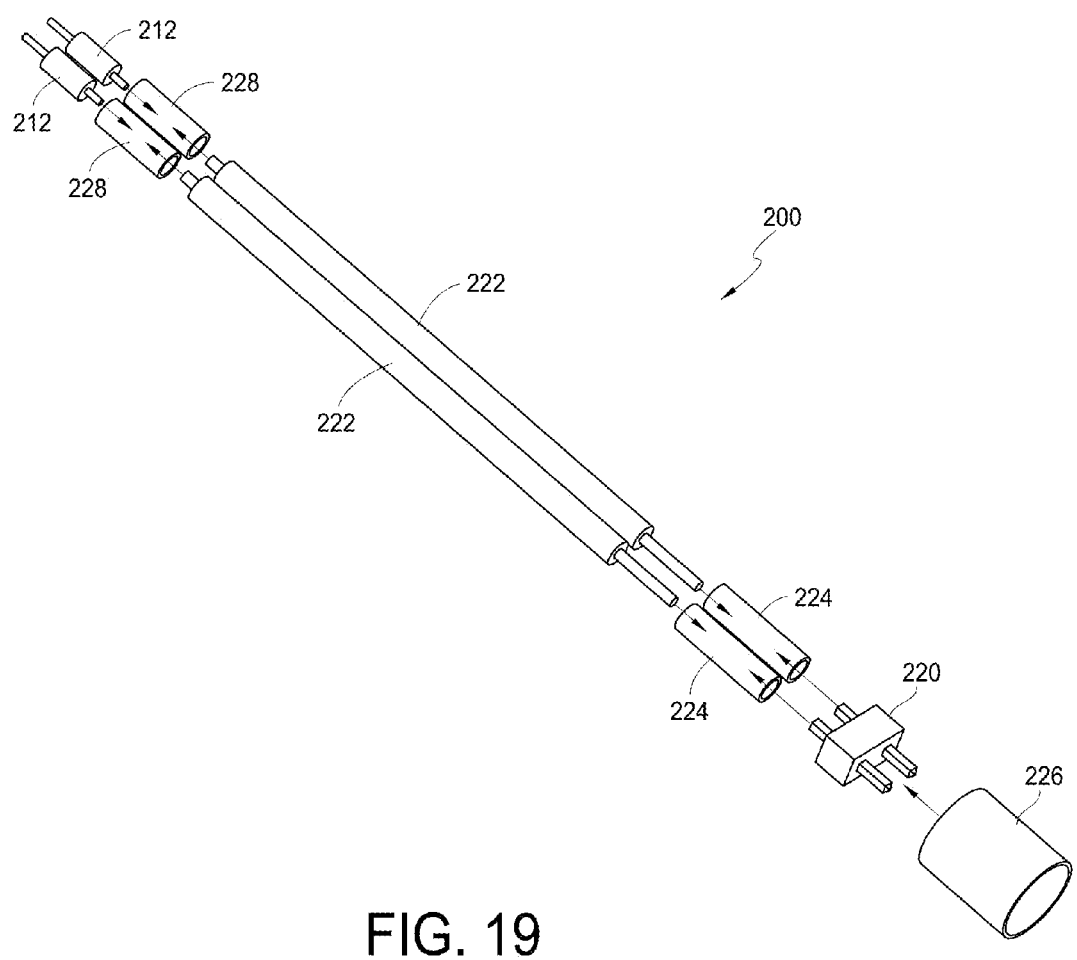
FIG. 19 is an expanded view of a second exemplary compensating electrical test probe tip optimized adapter in which the compensating networks are configured with the transmission paths of a twisted pair adapter.
Figure 20:
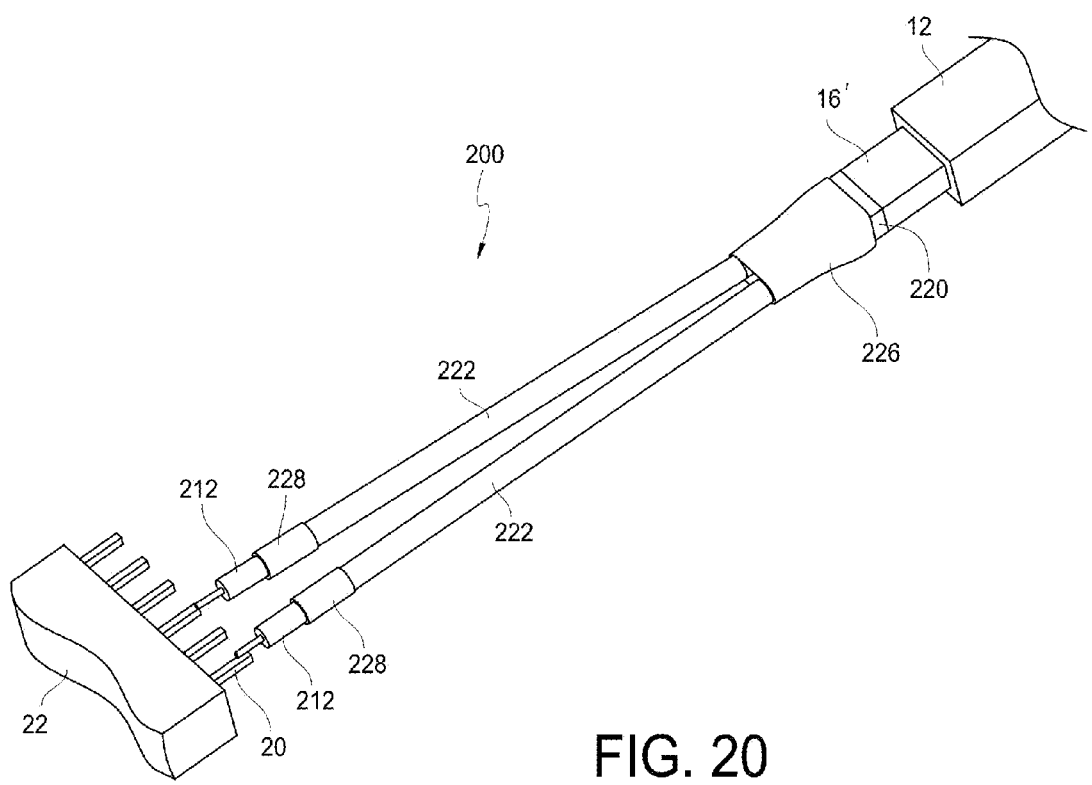
FIG. 20 is a perspective view of the second exemplary compensating electrical test probe tip optimized adapter probing two signal testing points.

As shown in FIGS. 19-20, the second exemplary compensating adapter is a twisted pair adapter 200.

One preferred embodiment of the twisted pair adapter 200 of the present invention includes at least one transmission path that, starting from the probing head 12 and mechanical point of contact 16', includes (from the head connection end to the probing end) a square pin pair 220, a pair of wires 222 (shown as insulated stranded wires), and the compensating network 212. The elements of the transmission path associated such that they form the at least one transmission path. In the shown twisted pair adapter 200, each pin of the square pin pair 220 is attached to a respective stripped end (a first end) of one of the wires 222. In the shown configuration, each pin 220 is attached to and held in place with the stripped end 222. Thin walled, adhesive lined heat shrink 224 may be used to accomplish the attaching and/or holding. A larger thin walled heat shrink 226 may be used for additional attaching, holding, and/or protection. Each opposite stripped end (a second end) of the pair of wires 222 (opposite from the end attached to the square pin pair 220) is attached to a respective one of the compensating networks 212. In the shown configuration, each opposite end 222 is attached to and held in place with a respective compensating network 212. Thin walled, adhesive lined heat shrink 228 may be used to accomplish the attaching and/or holding. In the shown configuration, the compensating network 212 slightly protrudes from the heat shrink 228. The shown resulting configuration is a V-shaped adapter with the square pin pair 220 at the bottom joined end of the "V" and the compensating networks 212 at the upper ends of the "V."

The compensating network 212 (which includes both shown compensating networks 212) of the twisted pair adapter 200 is a miniature leaded resistor (shown as a 54 ohm resistor ±1%). The compensating network 212 may include components such as resisters, capacitors, circuits, a combination of components, and/or other compensating means known or yet to be discovered. The compensating network 212 is preferably positioned at (or as near as possible to) the ends of the twisted pair adapter 200 that is to contact the signal testing point 20. In this way, instead of only being optimized to the mechanical point of contact 16', the combination of the twisted pair adapter 200 and the electrical test probe is optimized for bandwidth performance all the way to the signal testing point 20.

Y-Lead Adapter

Figure 21:
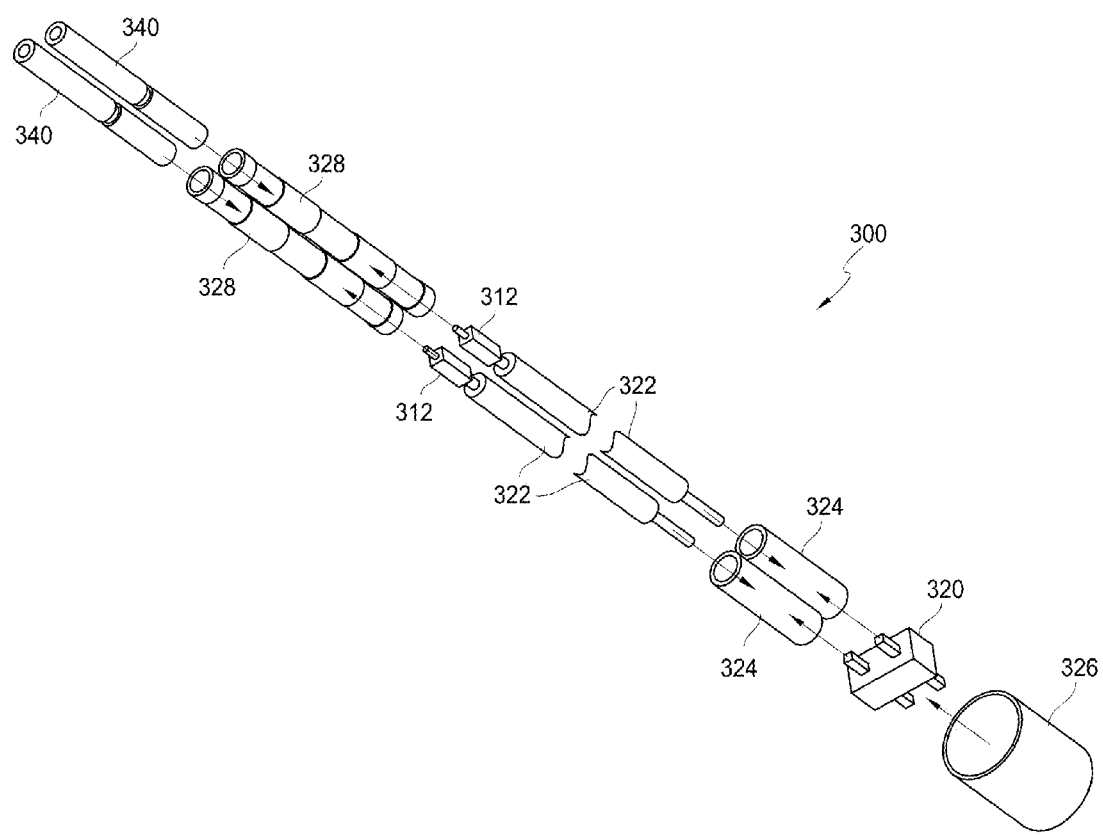
FIG. 21 is an expanded view of a third exemplary compensating electrical test probe tip optimized adapter in which the compensating networks are configured with the transmission paths of a Y-lead adapter.
Figure 22:
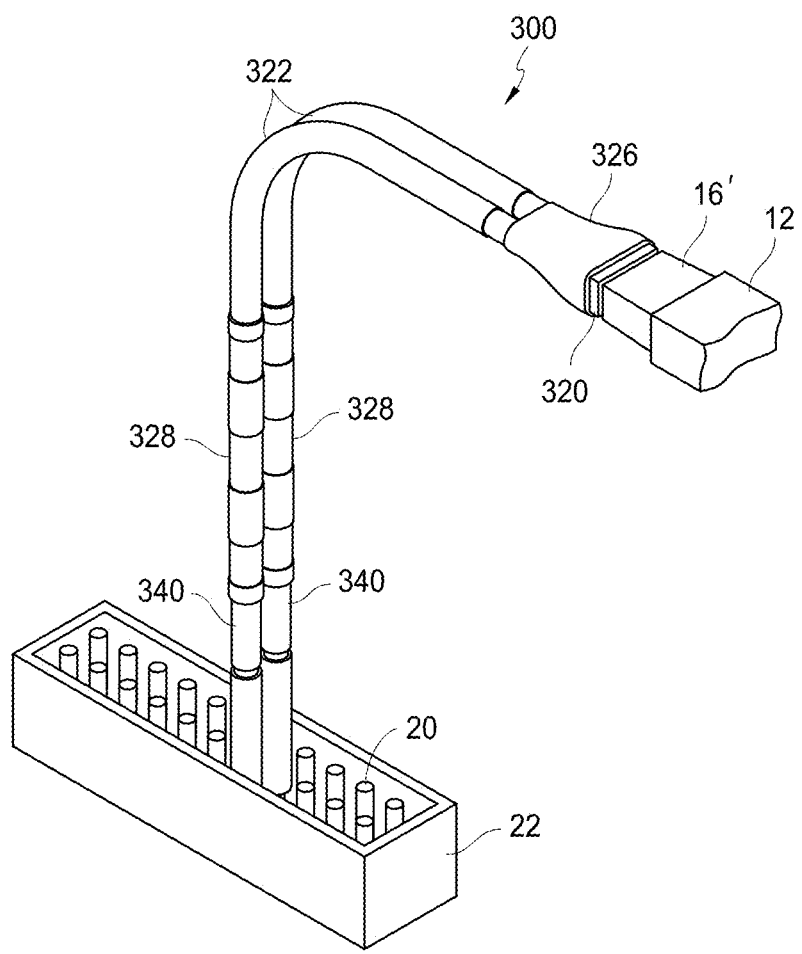
FIG. 22 is a perspective view of the third exemplary compensating electrical test probe tip optimized adapter probing two signal testing points.
Figure 23:
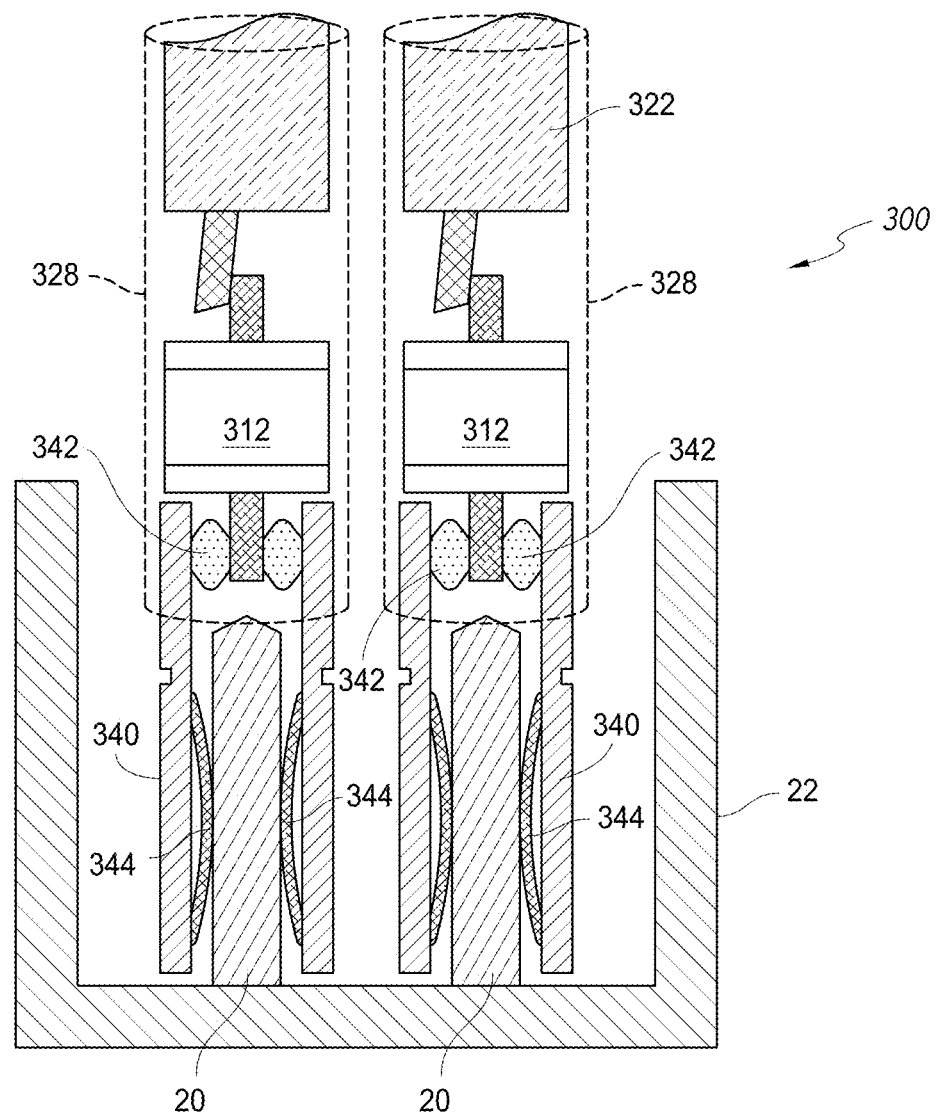
FIG. 23 is a cross-sectional view of the third exemplary compensating electrical test probe tip optimized adapter probing two signal testing points.
Figure 24:
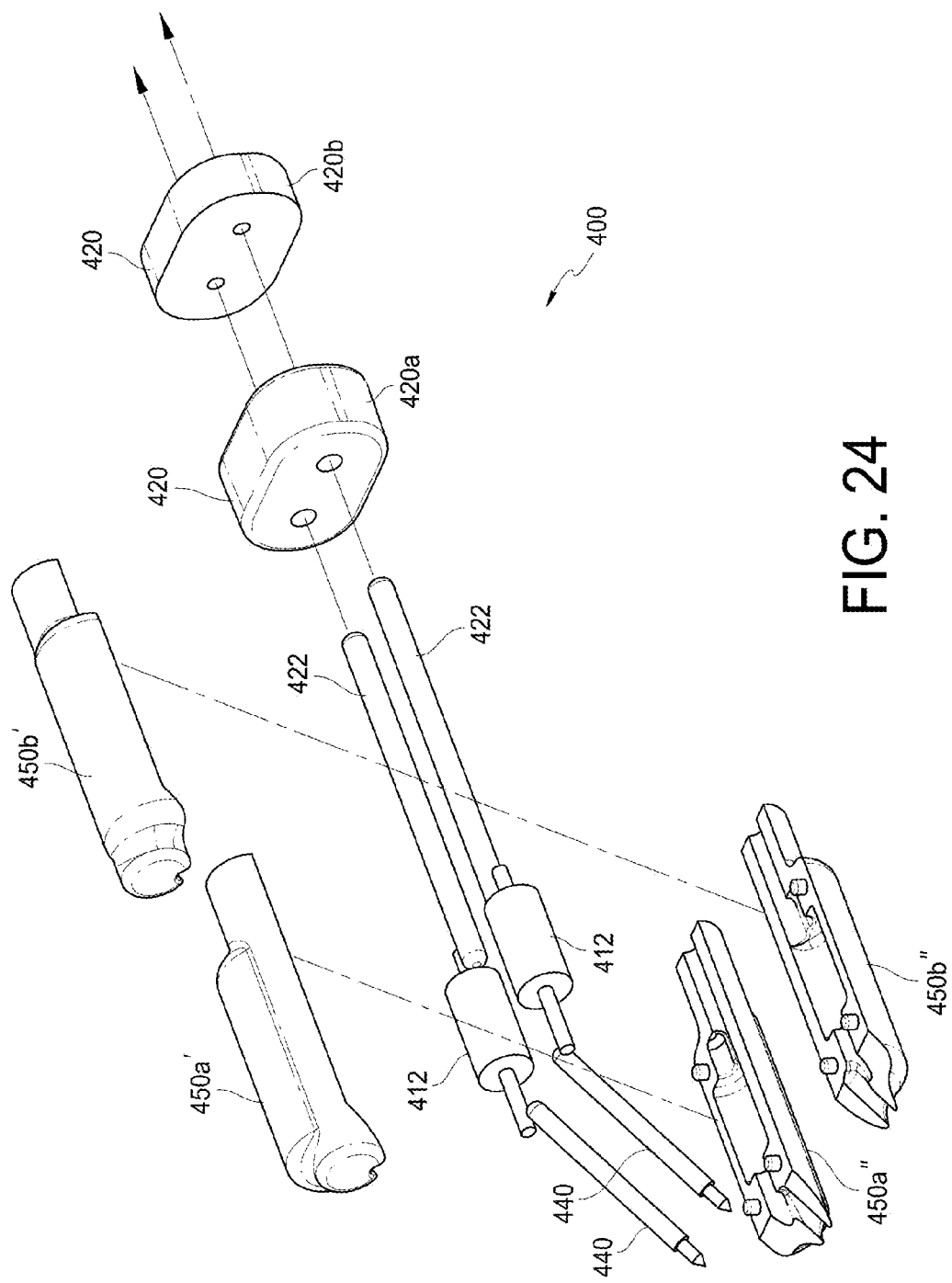
FIG. 24 is an expanded view of a fourth exemplary compensating electrical test probe tip optimized adapter in which the compensating networks are configured with the transmission paths of a swivel pogo tip pair adapter.
Figure 25:
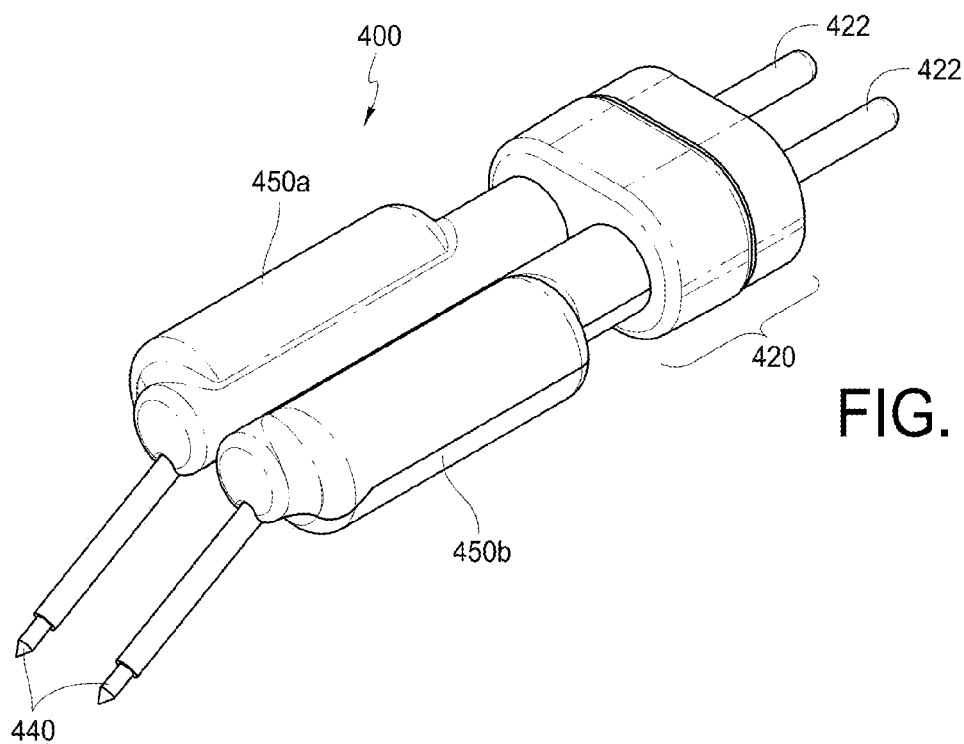
FIG. 25 is a perspective view of the fourth exemplary compensating electrical test probe tip optimized adapter.
Figure 26:
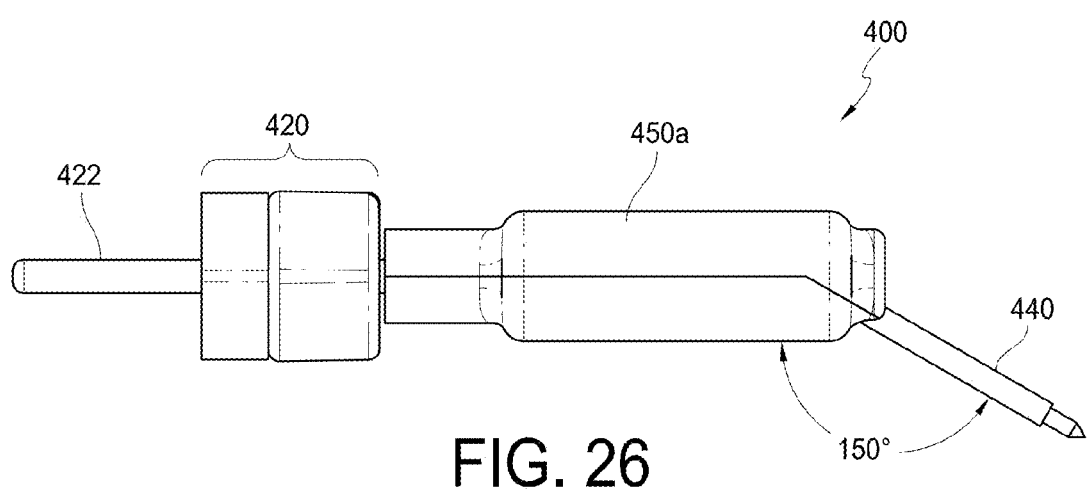
FIG. 26 is a side view of the fourth exemplary compensating electrical test probe tip optimized adapter.

As shown in FIGS. 21-23, the third exemplary compensating adapter is a Y-lead adapter 300 that is particularly useful for connecting with and/or probing square pins.

One preferred embodiment of the Y-lead adapter 300 of the present invention includes at least one transmission path that, starting from the probing head 12 and mechanical point of contact 16', includes (from the head connection end to the probing end) a square pin pair 320, a pair of wires 322 (shown as insulated stranded wires), the compensating network 312, and a square pin socket 340. The elements of the transmission path associated such that they form the at least one transmission path. In the shown Y-lead adapter 300, each pin of the square pin pair 320 is attached to a respective stripped end (a first end) of one of the wires 322. In the shown configuration, each pin 320 is attached to and held in place with the stripped end 322. Thin walled, adhesive lined heat shrink 324 may be used to accomplish the attaching and/or holding. A larger thin walled heat shrink 326 may be used for additional attaching, holding, and/or protection. Each opposite stripped end (a second end) of the pair of wires 322 (opposite from the end attached to the square pin pair 320) is attached to a respective one of the compensating networks 312 (at a first end of the compensating network 312). In the shown configuration, each opposite end 322 is attached to and held in place with (and may be soldered to) a respective compensating network 312 which, in turn, is attached (at a second end of the compensating network 312) to and held in place with the square pin socket 340. As shown in FIG. 23, a solder sleeve 328 may be used to enclose (which may include attaching and/or holding) an opposite end 322, a compensating network 312, and one end of a square pin socket 340. A thin walled, adhesive lined heat shrink 328 may be used in place of the shown solder sleeve 328. In the shown configuration, the compensating network 312 is completely enclosed within the solder sleeve 328. FIG. 23 also shows that a lead of each compensating network 312 may be soldered 342 to the inside surface of the square pin socket 340. The shown resulting configuration is a V-shaped adapter with the square pin pair 320 at the bottom joined end of the "V" and the square pin sockets 340 at the upper ends of the "V." FIG. 23 shows the inner springs 344 of the square pin socket 340 gripping the exterior surfaces of the signal testing points 20.

The compensating network 312 (which includes both shown compensating networks 312) of the Y-lead adapter 300 is a miniature leaded resistor (shown as a 54 ohm resistor ±1%). The compensating network 312 may include components such as resisters, capacitors, circuits, a combination of components, and/or other compensating means known or yet to be discovered. The compensating network 312 is preferably positioned at (or as near as possible to) the ends of the Y-lead adapter 300 that is to contact the signal testing point 20. In this way, instead of only being optimized to the mechanical point of contact 16', the combination of the Y-lead adapter 300 and the electrical test probe is optimized for bandwidth performance all the way to the signal testing point 20.

Swivel Pogo Tip Pair Adapter

Figure 27:
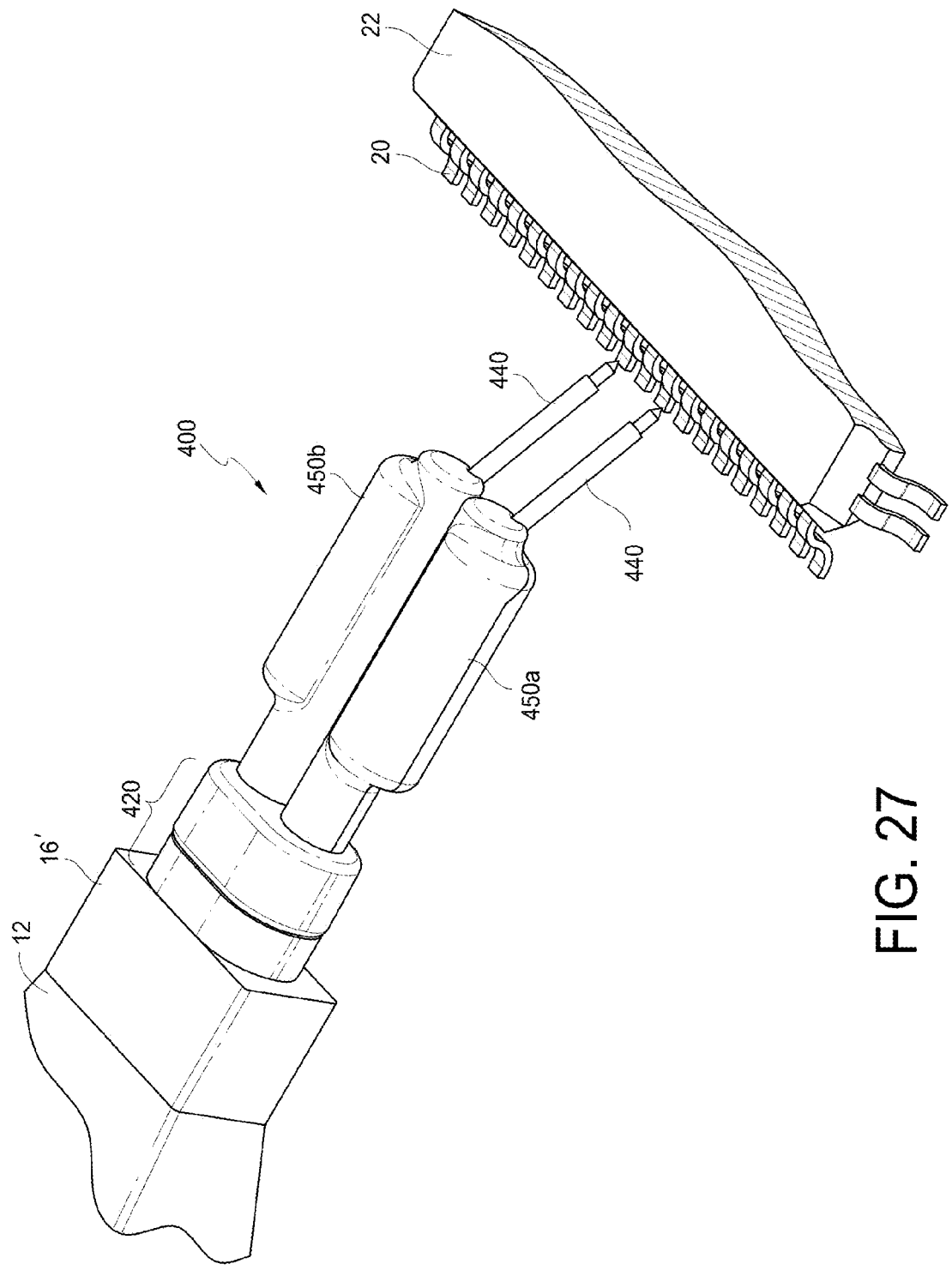
FIG. 27 is a perspective view of the fourth exemplary compensating electrical test probe tip optimized adapter probing two signal testing points, the two signal testing points being a medium distance apart.
Figure 28:
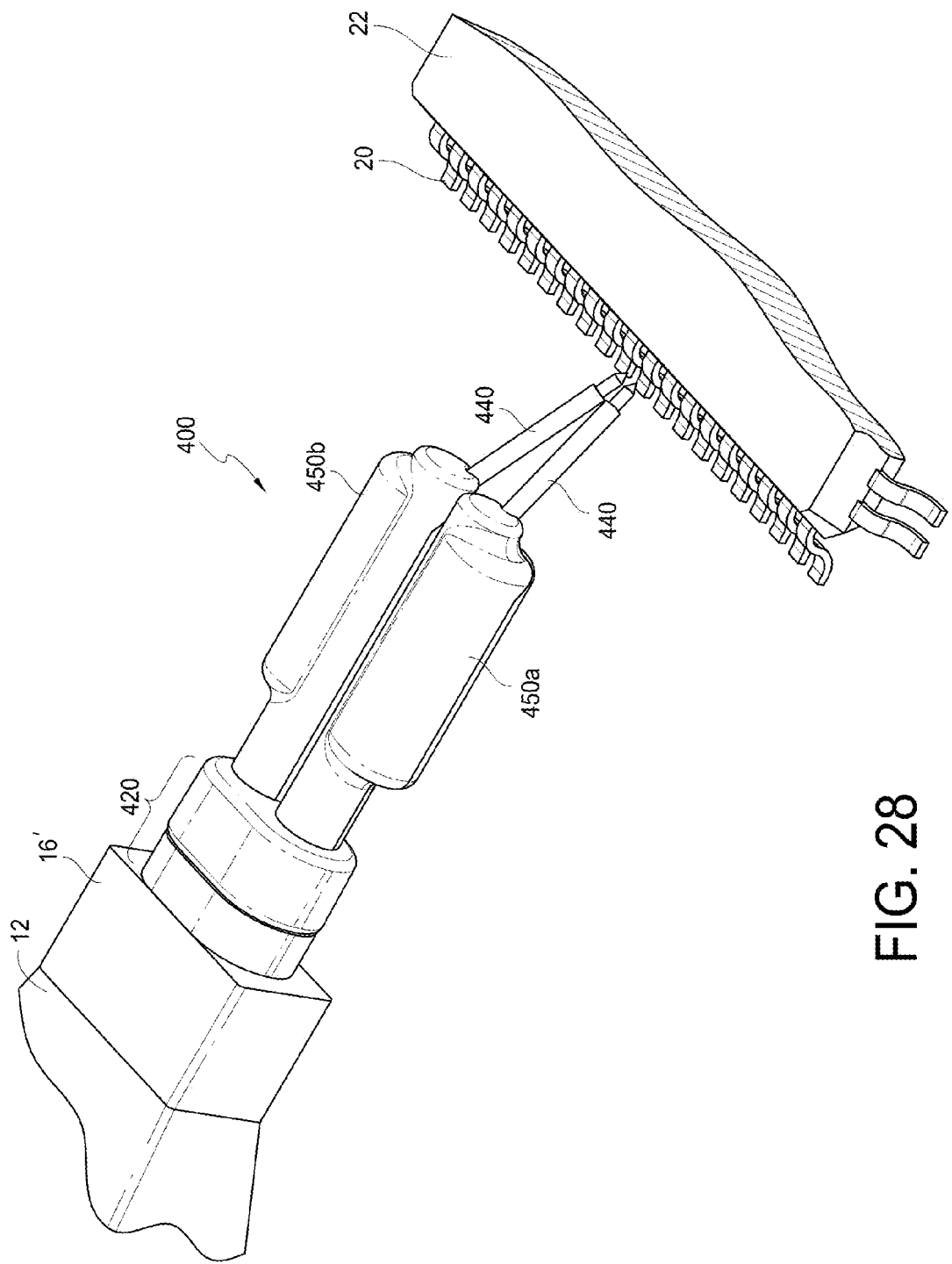
FIG. 28 is a perspective view of the fourth exemplary compensating electrical test probe tip optimized adapter probing two signal testing points, the two signal testing points being a relatively small distance apart.
Figure 29:
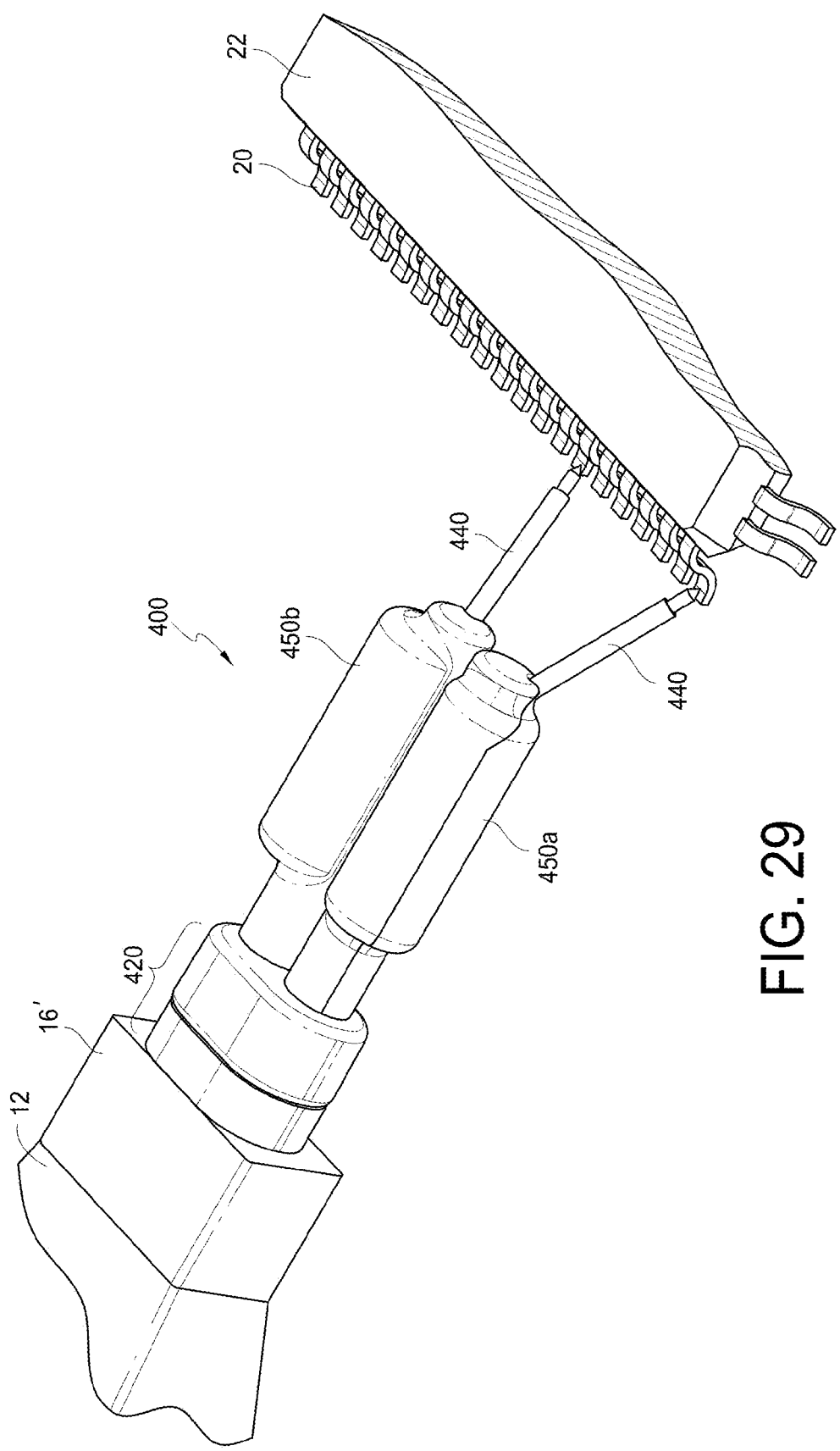
FIG. 29 is a perspective view of the fourth exemplary compensating electrical test probe tip optimized adapter probing two signal testing points, the two signal testing points being a relatively large distance apart.

As shown in FIGS. 24-29, the fourth exemplary compensating adapter is a swivel pogo tip pair adapter 400 (also referred to as a spin browser tip adapter 400). The swivel pogo tip pair adapter is particularly adapted to pairs of even and uneven contact points (e.g. vias, through hole pins, and ceramic resistors and capacitors). In addition to x-axis compliance and y-axis compliance, the swivel pogo tip pair adapter 400 also has z-axis compliance. The shown swivel pogo tip pair adapter can have spacing ranging from 0.00" to approximately 0.300". FIG. 27 shows the swivel pogo tip pair adapter 400 being used to probe two signal testing points 20 that are a medium distance apart. FIG. 28 shows the swivel pogo tip pair adapter 400 being used to probe two signal testing points 20 that are a relatively small distance apart. FIG. 29 shows the swivel pogo tip pair adapter 400 being used to probe two signal testing points 20 that are a relatively large distance apart.

One preferred embodiment of the swivel pogo tip pair adapter 400 of the present invention includes at least one transmission path that, starting from the probing head 12 and mechanical point of contact 16', includes (from the head connection end to the probing end) two straight pins 422, the compensating network 412, and a pair of pogo pins 440 (that may be a pogo-rotational-action pin 40 or it may be a standard pogo pin). The elements of the transmission path associated such that they form the transmission path. In the shown swivel pogo tip pair adapter 400, one end of the straight pins 422 are held together by a pivot fitting 420a and an interference fitting 420b (referred to jointly as the pivot interference fitting 420). The pivot fitting 420a may be a plastic or polycarbonate part having two apertures defined therein. The interference fitting 420b may be a rubber or foam part having two apertures defined therein that provides rotational resistance (functioning as a friction gasket). The apertures of the pivot fitting 420a and the interference fitting 420b are aligned to form two paths through which the two straight pins 422 are inserted (one through each aperture path). Once positioned through the aperture paths, the straight pins 422 are able to rotate with minimal effort (a user can easily rotate the pins using his fingers), but because of the rotational resistance the straight pins 422 do not spin loosely. Each opposite end (second end) of the pair of straight pins 422 (opposite from the end inserted through the pivot interference fitting 420) is attached to a respective one of the compensating networks 412. In the shown configuration, each opposite end 422 is attached to and held in place with a first end of a respective compensating network 412 (shown as a leaded resistor) using solder or other known methods. The other (second) end of the compensating network 412 is attached to and held in place with an associated pogo pin 440 using solder or other known methods. As shown, the pogo pin 440 is attached at an angle (shown as 150°) to the straight pin 422 and the compensating network 412. External housings 450a and 450b are formed from upper housing parts (450a' and 450b') and lower housing parts (450a" and 450b"). The upper housing parts (450a' and 450b') and lower housing parts (450a" and 450b") may be plastic or polycarbonate parts that are connected together (e.g. by press fitting and/or adhesive such as UV glue). Each of the external housings 450a and 540b encloses part of a respective straight pin 422 (the part in front of the pivot interference fitting 420), a compensating network 412, and one end of the pogo pin 440. The opposite front probing end of each pogo pin 440 protrudes from the respective housings 450a, 450b.

The compensating network 412 (which includes both shown compensating networks 412) of the swivel pogo tip pair adapter 400 is a miniature leaded resistor (for example, a 20 ohm resistor ±1% or a 30 ohm resistor ±1%). The compensating network 412 may include components such as resisters, capacitors, circuits, a combination of components, and/or other compensating means known or yet to be discovered. The compensating network 412 is preferably positioned at (or as near as possible to) the ends of the swivel pogo tip pair adapter 400 that is to contact the signal testing point 20. In this way, instead of only being optimized to the mechanical point of contact 16', the combination of the swivel pogo tip pair adapter 400 and the electrical test probe is optimized for bandwidth performance all the way to the signal testing point 20.

Flexible Tab-Board Adapter

Figure 32:
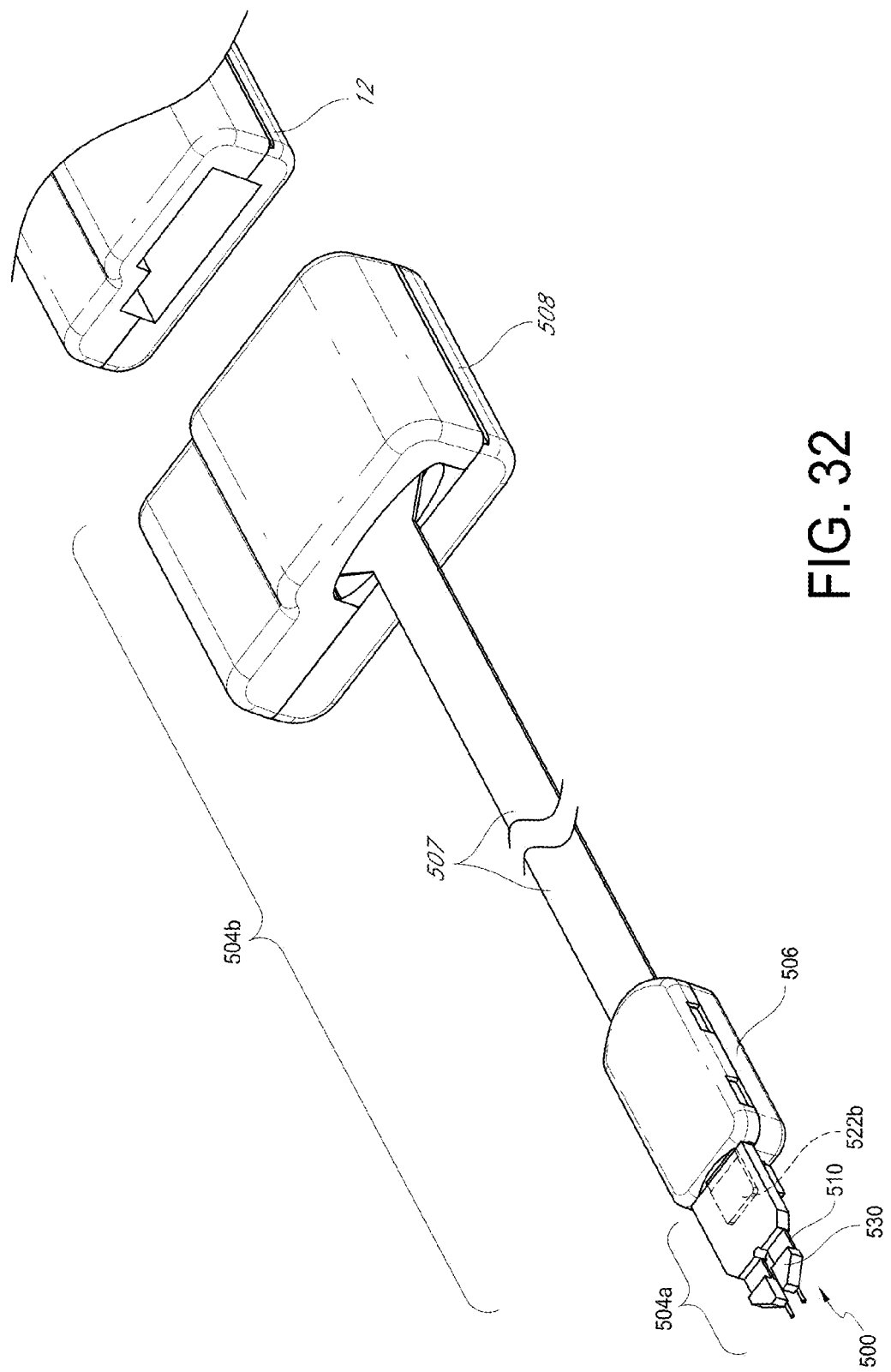
FIG. 32 is a bottom perspective view of the test probe tip shown in FIG. 30 having the flexible tab-board adapter, the removable tip module engaged with the flexible transmission line extension using the module-extension connector.
Figure 33:
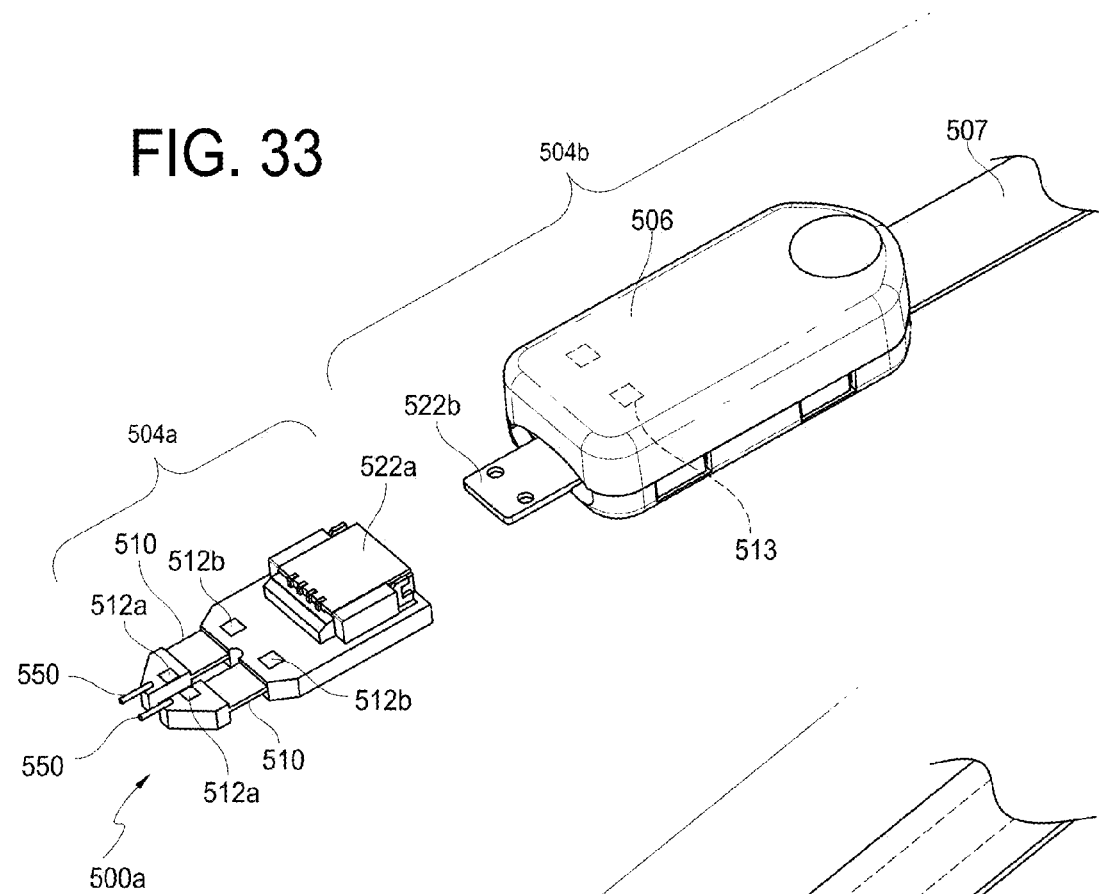
FIG. 33 is an enlarged perspective view of the flexible tab-board adapter, the module-extension connector being disengaged so that the removable tip module is remote from the flexible transmission line extension, the flexible tab-board adapter being shown as a wire-tipped flexible tab-board adapter.
Figure 34:
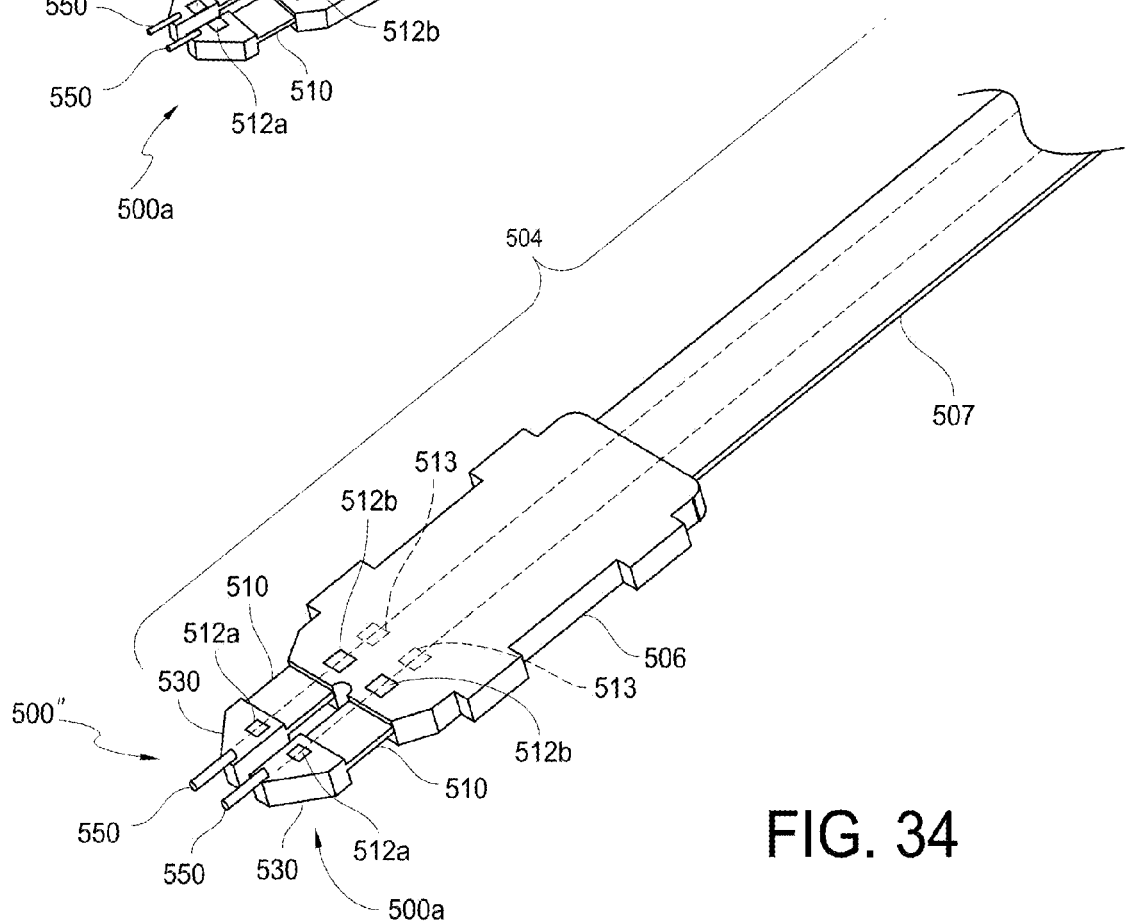
FIG. 34 is an enlarged perspective view of the fifth exemplary compensating adapter used in a test probe tip having a unitary flexible printed circuit board such that the flexible tab-board adapter is integral with the flexible transmission line extension, the flexible tab-board adapter being shown as a wire-tipped flexible tab-board adapter.

As shown in FIGS. 30-40, the fifth exemplary compensating adapter (which can also be considered a "compensating network adapter" or a "conductive connector compensating adapter") includes a flexible tab-board adapter 500 (alternatives of which being shown as 500a-500g, the flexible tab-board adapter 500 and variations thereof also referred to as scissor paddle tip adapters 500) as at least part of the compensating "probing tip" optimized adapter (shown in FIGS. 30-33 as a two-part compensating "probing tip" optimized adapter 504a, 504b and in FIG. 34 as a unitary compensating "probing tip" optimized adapter 504). The flexible tab-board adapter 500 is particularly suited to applications that require high frequency RF. One reason that the flexible tab-board adapter 500 has higher frequency performance is because there is flexibility (flex 510) at least partially behind a compensating network 512. In other words, at least part of the compensating network 512 is positioned beyond the flex 510 toward the probing end.

Figure 30:
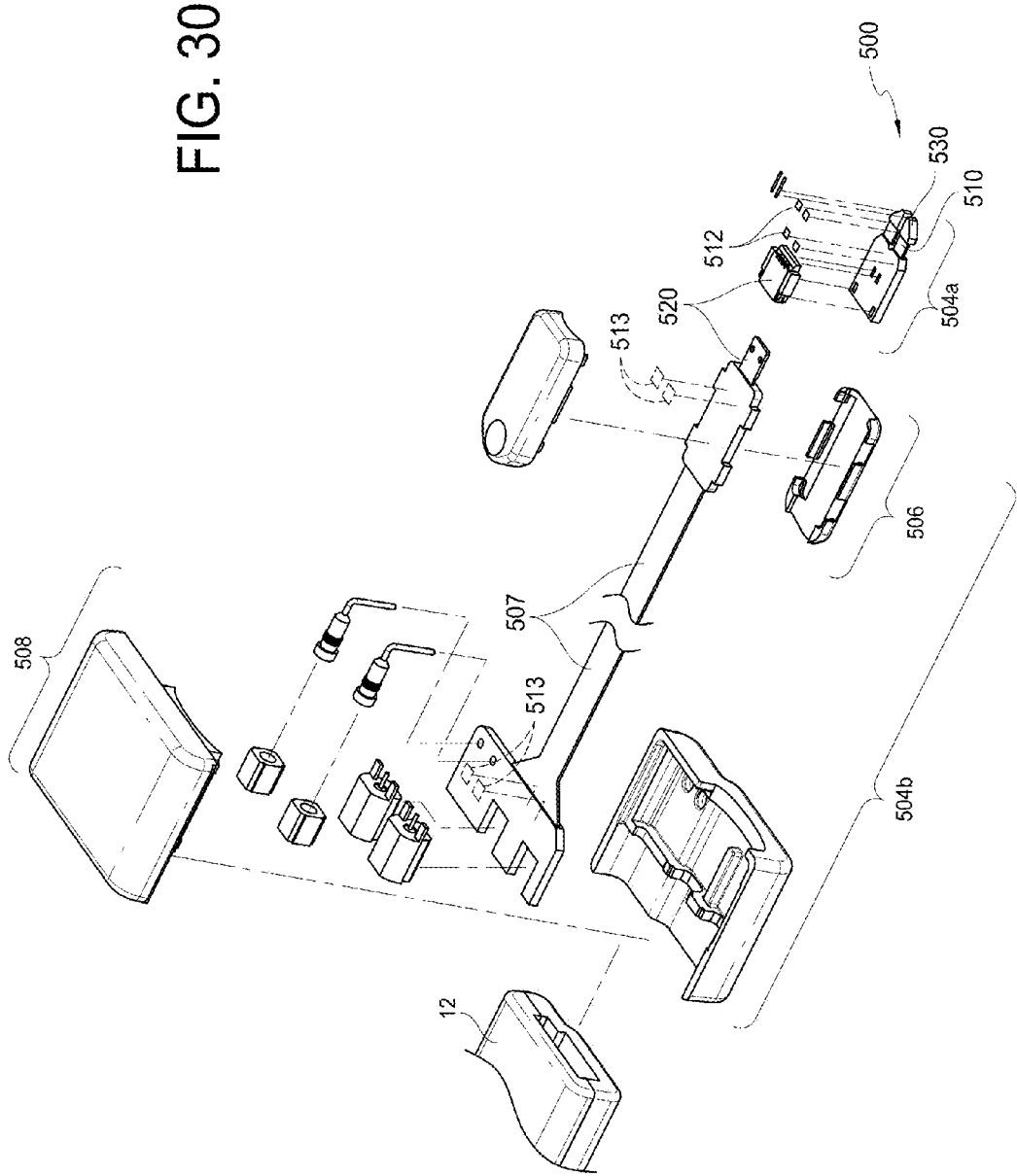
FIG. 30 is an exploded view of a fifth exemplary compensating adapter implemented as a flexible tab-board adapter, the flexible tab-board adapter being associated with a removable tip module that is removable and replaceable from a flexible transmission line extension using a module-extension connector.
Figure 31:
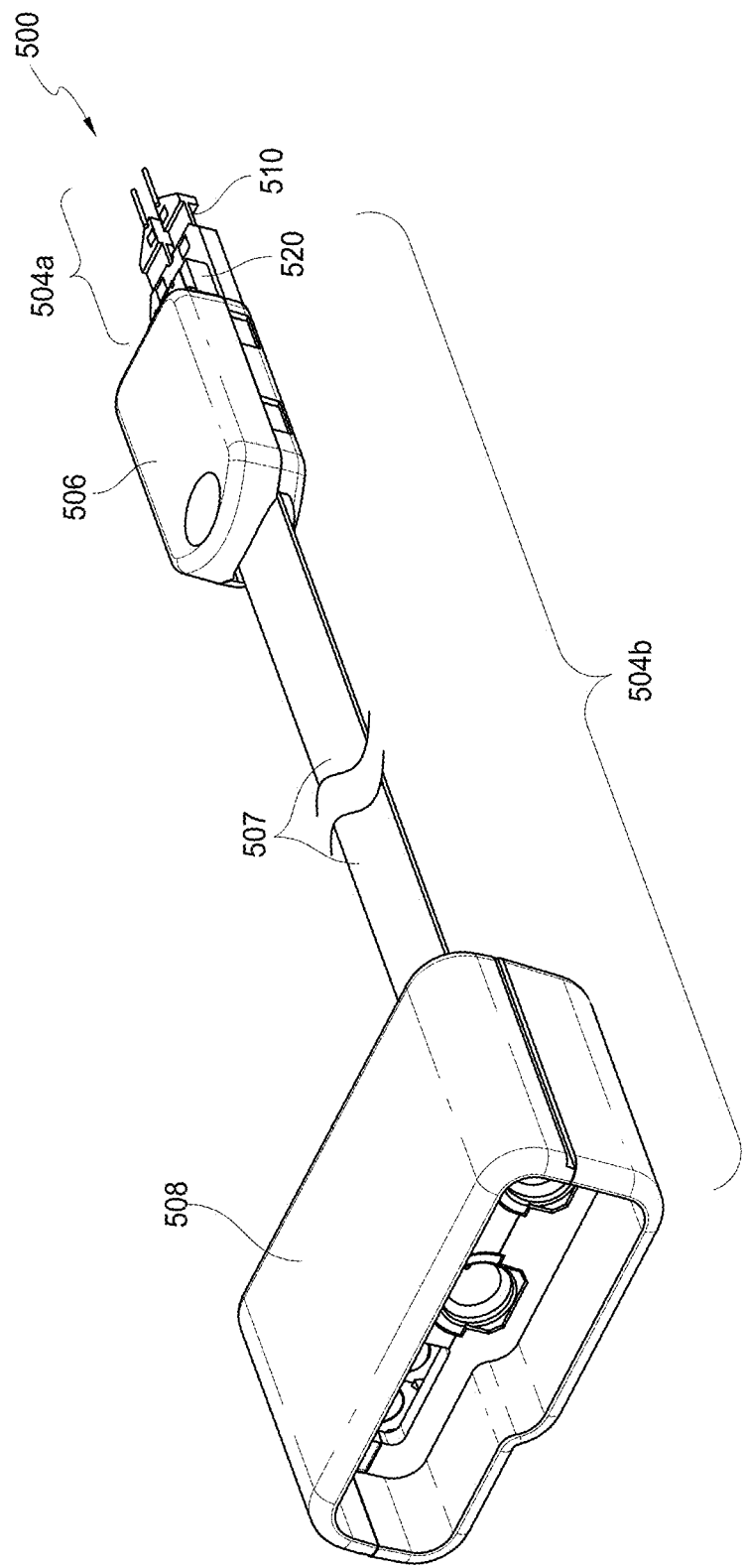
FIG. 31 is a rear perspective view of the test probe tip shown in FIG. 30 having the flexible tab-board adapter.

FIGS. 30-32 show exemplary components that might be included in either the two-part compensating adapter 504a, 504b or the unitary compensating adapter 504 associated with a flexible tab-board adapter 500. Starting with the probing end of the compensating adapter 504, the exemplary components in the at least one transmission path for electrically connecting at least one signal testing point to a probing head of an electrical test probe preferably include the following: a variation of the flexible tab-board adapter 500 (described in detail herein); a landing or grip 506 (that preferably includes a housing or protective cover for circuitry for protecting active or passive circuitry); a transmission line 507; and a probing head connector 508 for associating the head connection end of the compensating adapter 504 with the probing head. The probing head connector 508 is interconnectable with a probing head 12. Not shown in these figures is the transmission path (e.g. cable from the probing head) to the testing instrument connector or the testing instrument. The landing or grip 506 may include active or passive circuitry (shown as two phantom amplifiers 513 that may be at least one optional amplifier circuit). The transmission line 507 may be a flexible printed circuit board that may be enclosed or coated for protection. As shown, the transmission line 507 may include a differential transmission pair (e.g. a coupled 50 ohm transmission pair) that has a common mode of rejection. The transmission pair may have a common ground between the transmission lines. The shown length of the transmission line 507 is meant to be exemplary and it may be longer or shorter. In fact, the transmission line 507 may be optional if the landing or grip 506 is associated directly with the probing head connector 508. Similarly, the landing or grip 506 may be of any length or its functions, structure, or properties may be incorporated into the probing head connector 508. The probing head connector 508 may include active or passive circuitry (shown as two amplifiers) and may have an associated housing (e.g. the housing enclosing the active or passive circuitry as well as an end of the transmission lines 507). The shown landing or grip 506, transmission line 507, and probing head connector 508 are meant to be exemplary and for purposes of enablement. The various flexible tab-board adapters 500 may be associated with other types of landings or grips 506, transmission lines 507, probing head connectors 508, probing heads 12, transmission paths, testing instrument connectors, and/or the testing instruments.

FIGS. 30-33 show an exemplary flexible tab-board adapter 500 that is implemented as part of a two-part compensating "probing tip" optimized adapter 504a, 504b. The two-part compensating adapter 504a, 504b includes a removable and replaceable adapter module 504a (that includes the flexible tab-board adapter 500 or a variation thereof) and a flexible transmission line extension 504b. The two-part compensating adapter 504a, 504b shown in these figures includes a module-extension connector 520 for interconnecting the removable adapter module 504a with the flexible transmission line extension 504b. The module-extension connector 520 has two components that can interconnect (and disconnect), one component 522a is associated with the removable adapter module 504a and the other component 522b is associated with the flexible transmission line extension 504b (shown, for example, as associated with the landing or grip 506). As shown in FIG. 32, when the two components 522a, 522b of the module-extension connector 520 are engaged/interconnected, the removable adapter module 504a is engaged/interconnected with the flexible transmission line extension 504b. When the two components 522a, 522b of the module-extension connector 520 are disengaged/disconnected the removable adapter module 504a may be separated from (so as to be removed and/or replaced) the flexible transmission line extension 504b. The module-extension connector 520 may be a ZIF (zero insertion force) connector such as those described or derived from the references incorporated by reference or ZIF connectors commercially available or yet to be developed. Other types of module-extension connectors 520 include, but are not limited to connectors that are capable of minimum reflection and loss at high frequency.

FIG. 34 shows an alternative exemplary flexible tab-board adapter 500 implemented as part of a unitary compensating "probing tip" optimized adapter 504 that includes the structure of the flexible tab-board adapter 504a in integral or unitary association with the flexible transmission line extension 504b. In the shown embodiment, the flexible tab-board adapter 500 is integral with the landing or grip 506. The unitary compensating adapter 504 omits the module-extension connector 520.

Figure 39:
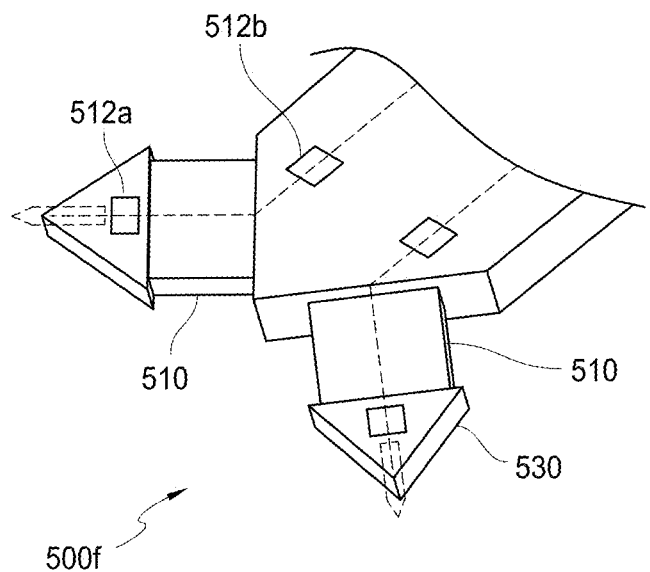
FIG. 39 is an enlarged perspective view of a variation of a flexible tab-board adapter and, specifically, a first alternative shaped flexible tab-board adapter.
Figure 40:
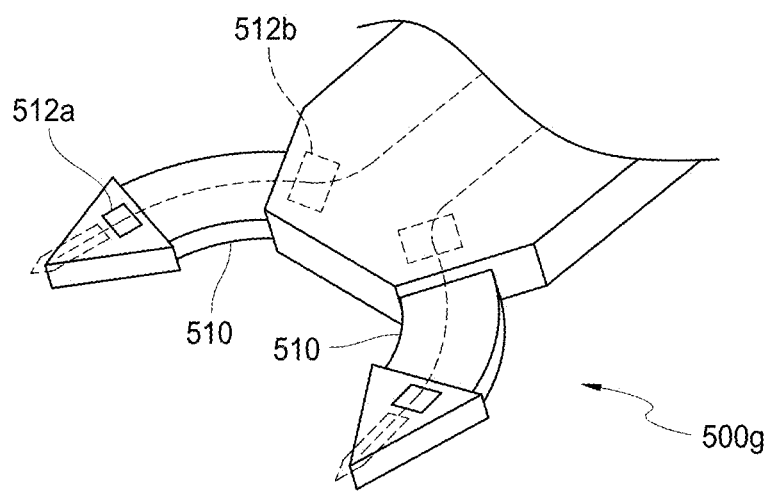
FIG. 40 is an enlarged perspective view of a variation of a flexible tab-board adapter and, specifically, a second alternative shaped flexible tab-board adapter.

Exemplary variations of the flexible tab-board adapter 500 include a wire-tipped flexible tab-board adapter 500a (FIGS. 33 and 34), a solderable flexible tab-board adapter 500b (FIG. 35), a conductor-covered flexible tab-board adapter 500c (FIG. 36), a socketed flexible tab-board adapter 500d (FIG. 37), an alternative conductor flexible tab-board adapter 500e (FIG. 38), a first alternative shaped flexible tab-board adapter 500f (FIG. 39), and a second alternative shaped flexible tab-board adapter 500g (FIG. 40). Unless specified otherwise, the phrase "flexible tab-board adapter 500" will be used to denote all the embodiments and variations of the flexible tab-board adapter. Any of the variations of the flexible tab-board adapter 500 could be used with either the two-part compensating adapter 504a, 504b or the unitary compensating adapter 504.

The variations of the flexible tab-board adapters 500 shown in FIGS. 30-40 have several commonalities with each other. Each variation has at least one (shown as two) flexible extensions (flex 510) with a first flex end and a second flex end. At the first flex end (towards the probing end) of each flex 510 is an associated tab 530. The tab 530 is relatively stiff (and may be a circuit board or circuit-board like component) as compared to the flex 510. The second flex end of each flex 510 is associated with a flexible transmission line extension 504b (either directly, via a landing, and/or as part of a removable adapter module 504a). Each flex 510 allows flexibility (relatively easy movement) between its associated tab 530 and the rest of the flexible tab-board adapter 504. As shown, the flexibility allows easy bending (although not floppiness), but the flexibility could include a shape-retainability (in which the flex 510 retains its new shape when the bending pressure is removed) or a spring-like characteristic (in which the flex 510 returns to its original shape when bending pressure is removed). In the shown embodiment, the association of the flex 510 and the tab 530 and the association of the flex 510 and the rest of the flexible tab-board adapter (and/or the rest of the removable adapter module 504a) are integral. This integral association structure may be created, for example, using a plurality of layers (one of which is flexible) and omitting or removing at least some of the layers to expose the portion of at least one flexible layer that is to be the flex 510. At least one layer that extends substantially from the probing end, through the flex 510, and beyond will have or be a transmission path. As compared to the flex 510, the tab 530 is relatively stiff. Alternative tabs, however, could allow some bending or flexing. Layering techniques and materials disclosed herein, described in references incorporated by reference, and known and yet to be discovered layering techniques, may be used to construct the structure. Specific layers are not shown in FIGS. 30-40, but they would be understood to be present in, for example, the tabs 530 (having multiple layers) where the flex 510 has fewer layers (e.g. a single layer).

Another commonality of the various flexible tab-board adapters 500 is the presence of at least one compensating network 512 (shown as compensating network 512a and compensating network 512b). (Compensating network 512a and compensating network 512b can be thought of as two distinct compensating networks or two halves of a single compensating network.) A compensating network 512a is shown as being associated with each tab 530. This compensating network 512a is positioned between the flex 510 and the probing end. Further, this compensating network 512a is preferably positioned substantially near (e.g. at or as near as possible to) the probing end that is to contact the signal testing point 20. This compensating network 512a provides compensation primarily for structure extending beyond the tab 530 (e.g. wire 550). A compensating network 512b is shown as being positioned on the part of the probing tip substantially adjacent the flex 510 and associated therewith. This compensating network 512b provides compensation primarily for transmission across the flex 510 to the tab 530. The compensating networks 512, 512a, 512b are designed to provide compensation for parasitics (e.g. inductance, capacitance, and other losses) associated with the compensating adapter 504. More specifically, the compensating networks 512, 512a, 512b are designed to match impedances and wave propagation with the structure for which they are compensating.

FIGS. 33 and 34 show a wire-tipped flexible tab-board adapter 500a in which a wire 550 may be connected to a point of the transmission path in the tab 530 beyond the compensating network 512 (shown as compensating network 512a and compensating network 512b). The wire 550 may be attached by the user or at the factory. Preferably, the wire has a diameter in the range of 0.127 mm (0.005") to 0.2286 mm (0.009") and a length perhaps somewhere in the range of 0.127 mm (0.005") to 1.270 mm (0.050"). The shortness of this length is made possible by the presence of the flex 510 because much of the necessary flexibility can be accomplished farther back (away from the probing end) in the adapter. In other words, as will be discussed, without the flex 510, the wire 550 must be longer.

Figure 35:
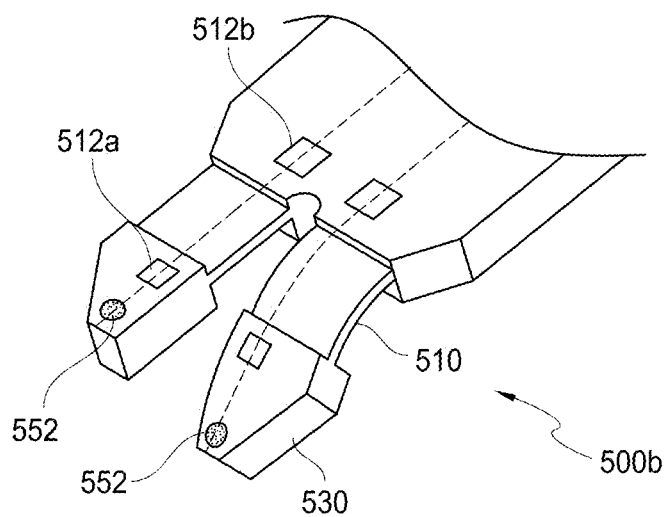
FIG. 35 is an enlarged perspective view of a variation of a flexible tab-board adapter and, specifically, a solderable flexible tab-board adapter.

FIG. 35 shows a solderable flexible tab-board adapter 500b in which solder 552 is positioned on a point of the transmission path in the tab 530 beyond the compensating network 512. The solder 552 may be melted by the user to attach desired tips or to attach directly to a device under test. It should be noted that all or part of the compensating networks 512a, 512b used in conjunction with the solderable flexible tab-board adapter 500b might be replaceable, adaptable, or programmable for their intended purpose.

Figure 36:
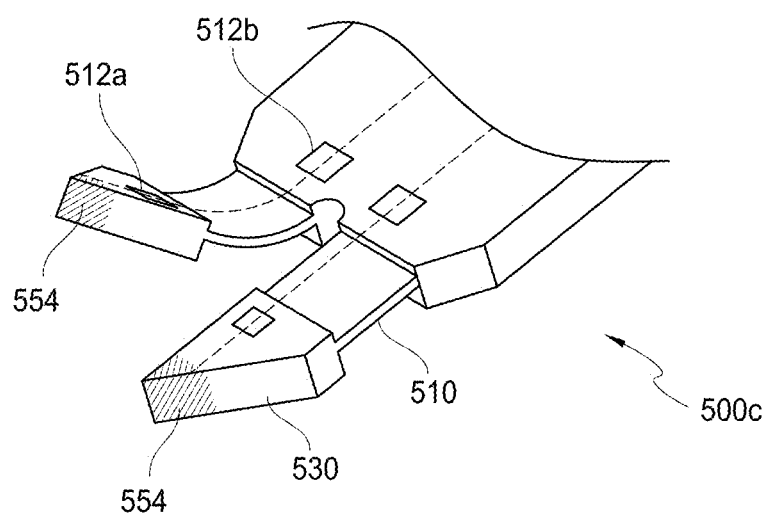
FIG. 36 is an enlarged perspective view of a variation of a flexible tab-board adapter and, specifically, a conductor-covered flexible tab-board adapter.

FIG. 36 shows a conductor-covered flexible tab-board adapter 500c in which a portion of the transmission path in the tab 530 beyond the compensating network 512 is coated, wrapped, or covered in a conductive material 554. The coating would allow the conductor-covered portion of the tab 530 to be used as the probe. Alternatively, a conductive portion of the transmission path could be left exposed. This figure also shows the tabs 530 having a slightly pointed shape. Alternatively, the pointed shape may be created using the conductive material.

Figure 37:
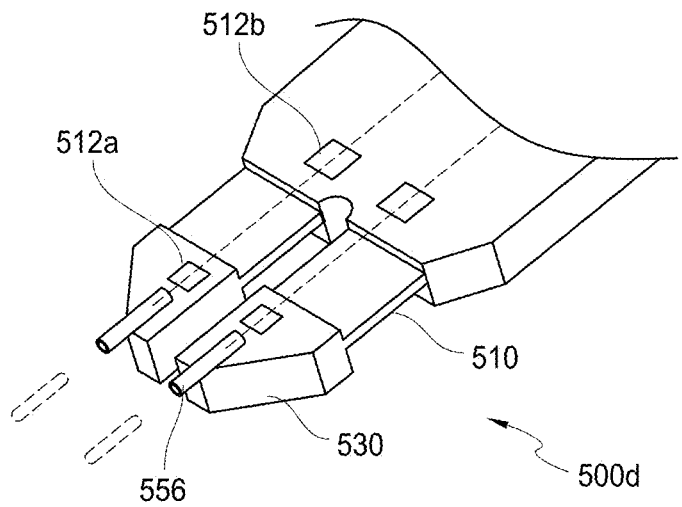
FIG. 37 is an enlarged perspective view of a variation of a flexible tab-board adapter and, specifically, a socketed flexible tab-board adapter.

FIG. 37 shows a socketed flexible tab-board adapter 500d in which a socket 556 may be connected to a point of the transmission path in the tab 530 beyond the compensating network 512. The user could then attach a desired accessory or probe tip or, alternatively, use the socket itself for probing. It should be noted that all or part of the compensating networks 512a, 512b used for the socketed flexible tab-board adapter 500d might be replaceable, adaptable, or programmable for their intended purpose.

Figure 38:
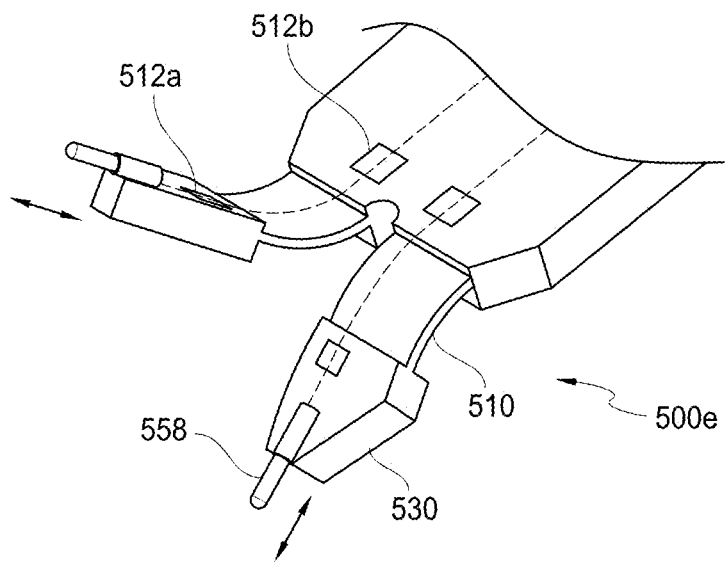
FIG. 38 is an enlarged perspective view of a variation of a flexible tab-board adapter and, specifically, an alternative conductor flexible tab-board adapter.

FIG. 38 shows an alternative conductor flexible tab-board adapter 500e in which an exemplary alternative conductor (shown as a pogo-pin 558) may be connected to a point of the transmission path in the tab 530 beyond the compensating network 512. The exemplary alternative conductor is meant to designate that other alternative conductors are included in the scope of the invention including, but not limited to resistive pogo tips, conductive spring tips, solder tips, or any other conductor known or yet to be discovered.

FIGS. 39 and 40 show first and second alternative shaped flexible tab-board adapters 500f, 500g. These are shown as examples of alternative shapes. Other shapes are possible. FIG. 40 also shows the compensating networks 512b in phantom to show that the compensating networks 512b are optional (in this and in other variations).

It should be noted that the variations of the adapters 500a-500g are meant to be exemplary. It should be noted that the characteristics of the variations of the adapters 500a-500g may be combined to form other variations. For example, the wires 550, solder 552, conductive material 554, sockets 556, or alternative conductors 558 of FIGS. 33-38 could be used on the alternative shaped flexible tab-board adapters 500f, 500g of FIGS. 39 and 40.

It should be noted that technology described elsewhere in this specification may be used to implement exemplary compensating adapters. For example, as described herein, resistance (or capacitance) may be provided by resistance (or capacitance) devices shown as the compensating networks 512. The compensating networks preferably include components such as resisters, capacitors, circuits (including active circuitry, amplifiers, etc.), a combination of components, and/or other compensating means known or yet to be discovered. Exactly which component(s) are in the compensating networks 512 is determined by the inductance and other parasitics for which the compensating network is compensating.

It should also be noted that in some situations, active circuitry 513 may be used in addition to and/or in place of the compensating networks to perform complex electrical functions. Active circuitry 513 (such as a differential amplifier) has already been discussed. Other exemplary complex electrical functions include, but are not limited to, the following: transformation of impedances between the high section (e.g. 250 ohm) of the adapter (such as 504a) and the subsequent low impedance (e.g. 50 ohm) section of the transmission line 507 as well as the test equipment cabling 12; positive gain to increase the amplitude of small signals; common mode rejection; filtering such as equalization compensation for transmission line loss associated with the transmission line 507 and the test equipment cabling 12.

The active and/or passive circuitry 512, 513 may reside near the head end of the adapter. Alternative positioning of the active and/or passive circuitry 512, 513 is possible. For example, active circuitry 513 is shown positioned near the probing head connectors 508.

A "power indicator" (e.g. a visual indicator) may optionally be associated with the flexible tab-board adapter 500 or other compensating adapters. The power indicator (not shown) may be used to show application of power to the adapter's active circuits or other types of adapter status. Such a power indicator may be implemented, for example, with printed circuit board mount light emitting diode, and may be optionally integrated as part of active circuitry on the landing or grip 506 or the probing head connector 508.

It should be noted that a ground lead (not shown) may optionally be associated with the flexible tab-board adapter 500 or other compensating adapters. For example, the user may install a removable ground lead to reduce the impact of common mode noise that could develop between the test instrument and the device under test that may otherwise conduct directly through the signal path of the adapter.

It should be noted that known technology (including technology assigned to the assignee of the invention described herein and/or technology invented by the inventor of the invention described herein) may be used to implement this exemplary compensating adapter. In addition, this exemplary compensating adapter may build upon and improve on other technology. For example, U.S. Pat. No. 7,019,544 to Jacobs et al. describes a transmission line input structure test probe that is herein incorporated by reference. The modularity of the flexible tab-board adapter 500 shown in FIGS. 30-33 is similar to the modularity described in U.S. Pat. No. 7,432,698 to Campbell et al. which describes a modular active test probe and removable tip module therefore, and is herein incorporated by reference. Still further, U.S. Pat. No. 7,262,614 to Campbell shows a planar probing tip having a body with two motion activatable test point connector projections, and is herein incorporated by reference. Finally, exemplary connectors between the removable tip module and the flexible transmission line extension (module-extension connectors) may be, for example, ZIF (zero insertion force) connectors such as those shown in or derived from U.S. Pat. No. 5,173,058 to Broeksteeg et al., U.S. Pat. No. 5,549,479 to Elco et al., U.S. Pat. No. 5,795,171 to Bernardini, U.S. Pat. No. 5,846,097 to Marian, Jr., U.S. Pat. No. 6,042,410 to Watanabe, U.S. Pat. No. 6,089,896 to Kosmala, U.S. Pat. No. 6,371,781 to Jones et al., U.S. Pat. No. 6,533,606 to Yamane, and U.S. Pat. No. 7,371,093 to Johnson.

Some of the advantages of the flexible tab-board adapter 500 can be seen when compared to known tips and adapters.

U.S. Pat. No. 7,371,093 to Johnson, for example, sets forth an interconnect circuit board and a carrier circuit board. The interconnect circuit board is shown as having two flexible leads (each with an associated isolation component that is discussed as being a thick film resistor-capacitor surface mounted network of 25 KΩ shunted by a small value of capacitance) mounted thereon. The carrier circuit board has a zero insertion force connector mounted thereon. As far as can be determined, there is a rigid interconnection between the interconnect circuit board and the zero insertion force connector. The leads are the only component that allows flexibility. Although disclosed as "short" (e.g. of diameter 0.15 mm (0.0059") and of the length perhaps somewhere in the range of 40 mm (1.5748") to 80 mm (3.1496")) in the realm of high frequency probes, this is rather long. The isolation component would have to compensate for the entire length.

In U.S. Pat. No. 7,262,614 to Campbell, as another example, it was recognized that there was an advantage to having some flexibility in a probing tip. The probing tip disclosed therein, however, would not be suitable to more modern high frequency probing needs. That probe includes structure that assists in the adjustment between two test point connector projections, but that structure limits how small the probing tip can be made.

DEFINITIONS

The following definitions enhance and explain the termination herein. The terms and phrases may have additional definitions and/or examples throughout the specification. Where otherwise not specifically defined, words, phrases, and acronyms are given their ordinary meaning in the art.

The term "associated" is defined to include integral or original, retrofitted, attached, connected (including functionally connected), positioned near, and/or accessible by.

It should be noted that relative terms (e.g. primary and secondary) are meant to help in the understanding of the technology and are not meant to limit the scope of the invention. Similarly, unless specifically stated otherwise, the terms "first," "second," and "third" are meant solely for purposes of designation and not for order or limitation.

The terms "may," "might," "can," and "could" are used to indicate alternatives and optional features and should only be construed as a limitation if specifically included in the claims. Claims not including a specific limitation should not be construed to include that limitation.

Unless specifically stated otherwise, the term "exemplary" is meant to indicate an example, representative, and/or illustration of a type. The term "exemplary" does not necessarily mean the best or most desired of the type.

It should be noted that, unless otherwise specified, the term "or" is used in its nonexclusive form (e.g. "A or B" includes A, B, A and B, or any combination thereof, but it would not have to include all of these possibilities). It should be noted that, unless otherwise specified, "and/or" is used similarly (e.g. "A and/or B" includes A, B, A and B, or any combination thereof, but it would not have to include all of these possibilities). It should be noted that, unless otherwise specified, the terms "includes" and "has" mean "comprises" (e.g. a device that includes, has, or comprises A and B contains A and B, but optionally may contain C or additional components other than A and B). It should be noted that, unless otherwise specified, the singular forms "a," "an," and "the" refer to one or more than one, unless the context clearly dictates otherwise.

Miscellaneous

It should be noted that topographies other than that of an integrated circuit 22 layout may be probed by the probing blade of the present invention.

It should be noted that the probing blade of the present invention may be used to provide a stable ground for high frequency probing and integrated circuit leg L probing. It should be noted that the probing blade is specifically not limited to a ground connection.

It should be noted that relational terms used in this specification are for purposes of clarity and are not meant to limit the scope of the invention. For example, the terms "top" and "bottom" or the terms "front" and "back" are meant to be relational and, if the probing blade were held in an alternative position, the terms could be reversed or changed completely to describe the new orientation. The term "associated" is defined to mean integral or attached, connected (including functionally connected), original, retrofitted, positioned near, and/or accessible by. The terms "may," "might," "can," and "could" (and terms similar thereto) are used to indicate alternatives and optional features and should only be construed as a limitation if specifically included in the claims.

The disclosures of the following applications and patents (that have been assigned to the assignee of the present application) are specifically incorporated herein by reference: U.S. Pat. No. 8,098,078, U.S. Pat. No. 7,671,613, and U.S. Provisional Patent Application Ser. No. 60/757,077, filed Jan. 6, 2006.

All references (including, but not limited to, publications, patents, and patent applications) cited or mentioned herein, whether supra or infra, are hereby incorporated by reference in their entirety.

It will thus be seen that the objects set forth above, among those made apparent from the preceding description, are efficiently attained and, since certain changes may be made in the above construction(s) without departing from the spirit and scope of the invention, it is intended that all matter contained in the description and/or shown in the accompanying drawings shall be interpreted as illustrative and not in a limiting sense.

It is also to be understood that the description and drawings are intended to cover all of the generic and specific features of the invention herein described and all statements of the scope of the invention which, as a matter of language, might be said to fall therebetween.

The terms and expressions that have been employed in the foregoing specification are used as terms of description and not of limitation, and are not intended to exclude equivalents of the features shown and described or portions of them. The scope of the invention is defined and limited only by the claims that follow.

The invention claimed is:

1. An adapter having a probing end and a head connection end, said head connection end of said adapter for associating with a probing head of an electrical test probe, said probing end of said adapter for contacting at least one signal testing point, said adapter comprising:
   (a) at least one transmission path providing an electrical connection between said probing end and said head connection end;
   (b) a flexible tab-board adapter associated with said probing end of said transmission path, said flexible tab-board adapter for contacting at least one signal testing point;
   (c) said flexible tab-board adapter having at least two flex, each flex having an associated at least one tab;
   (d) each said at least one tab being relatively stiff as compared to said at least one flex;
   (e) each said at least one flex allowing flexibility between its associated tab and the rest of said flexible tab-board adapter, said flexibility allowing easy bending, and said flexibility having either a shape-retainable characteristic or a spring-like characteristic, each flex having a first flex end and a second flex end;
   (f) at least part of at least one compensating network associated with said at least one tab at said first flex end, at least part of said at least one compensating network associated with said rest of said flexible tab-board adapter associated with said second flex end; and
   (g) a flexible transmission line extension associated with said at least one transmission path, and further comprising a module-extension connector, said module-extension connector having a first component associated with said flexible tab-board adapter and a second component associated with said flexible transmission line extension, the first component and second component of said module-extension connector being engageable and disengageable.

2. The adapter of claim 1, said at least one compensating network configured to compensate for parasitics of said adapter.

3. The adapter of claim 1, said flexible tab-board adapter being removable and replaceable.

4. The adapter of claim 1, wherein said flexible tab-board adapter being a variation of a flexible tab-board adapter selected from the group consisting of:
   (a) a wire-tipped flexible tab-board adapter;
   (b) a solderable flexible tab-board adapter;
   (c) a conductor-covered flexible tab-board adapter;
   (d) a socketed flexible tab-board adapter;
   (e) an alternative conductor flexible tab-board adapter;
   (f) an alternative shaped flexible tab-board adapter; and
   (g) an adapter being a combination of the variations listed in (a)-(f).

5. The adapter of claim 1, said at least one flex being easily bendable and shape-retainable such that said at least one flex retains its new shape when the bending pressure is removed.

6. The adapter of claim 1, said at least one flex being easily bendable and having spring-like characteristic such that said at least one flex returns to its original shape when bending pressure is removed.

7. An adapter having a probing end and a head connection end, said head connection end of said adapter for associating with a probing head of an electrical test probe, said probing end of said adapter for contacting at least one signal testing point, said adapter comprising:
  (a) at least one transmission path providing an electrical connection between said probing end and said head connection end;
  (b) at least one compensating network positioned substantially near said probing end, said at least one compensating network configured to compensate for parasitics of said adapter;
  (c) a flexible tab-board adapter associated with said probing end of said transmission path, said flexible tab-board adapter for contacting at least one signal testing point, said flexible tab-board adapter having at least two flex, each flex having a first flex end and a second flex end, said flexible tab-board adapter having at least one tab associated with said first flex end, each flex allowing flexibility between its associated tab and the rest of said flexible tab-board adapter, said flexibility allowing easy bending, and said flexibility having either a shape-retainable characteristic or a spring-like characteristic, each said at least one tab being relatively stiff as compared to its associated flex;
  (d) at least part of said at least one compensating network associated with each tab at said first flex end, at least part of said at least one compensating network associated with said rest of said flexible tab-board adapter associated with said second flex end; and
  (e) a flexible transmission line extension associated with said at least one transmission path, and further comprising a module-extension connector, said module-extension connector having a first component associated with said flexible tab-board adapter and a second component associated with said flexible transmission line extension, the first component and second component of said module-extension connector being engageable and disengageable.

8. The adapter of claim 7, said flexible tab-board adapter being removable and replaceable.

9. The adapter of claim 7, wherein said flexible tab-board adapter being a variation of a flexible tab-board adapter selected from the group consisting of:
  (a) a wire-tipped flexible tab-board adapter;
  (b) a solderable flexible tab-board adapter;
  (c) a conductor-covered flexible tab-board adapter;
  (d) a socketed flexible tab-board adapter;
  (e) an alternative conductor flexible tab-board adapter;
  (f) an alternative shaped flexible tab-board adapter; and
  (g) an adapter being a combination of the variations listed in (a)-(f).

10. The adapter of claim 7, wherein said at least one compensating network includes at least one component selected from the group consisting of:
  (a) at least one resister;
  (b) at least one capacitor;
  (c) at least one inductor;
  (d) a circuit; and
  (e) a combination of at least two components selected from the components listed in (a)-(d).

11. An adapter having a probing end and a head connection end, said head connection end of said adapter for associating with a probing head of an electrical test probe, said probing end of said adapter for contacting at least one signal testing point, said adapter comprising:
  (a) at least one transmission path providing an electrical connection between said probing end and said head connection end;
  (b) a flexible tab-board adapter associated with said probing end of said transmission path, said flexible tab-board adapter for contacting at least one signal testing point, said flexible tab-board adapter comprising:
    (i) at least two flex, each flex having a first flex end and a second flex end;
    (ii) at least one tab, each at least one tab associated with said first flex end of an associated at least one flex, each at least one tab being relatively stiff as compared to said at least one flex;
    (iii) said second flex end associated with the rest of said flexible tab-board; and
    (iv) each said at least one flex allowing flexibility between its associated tab and said rest of said flexible tab-board adapter, said flexibility allowing easy bending, and said flexibility having either a shape-retainable characteristic or a spring-like characteristic;
  (c) at least one compensating network, at least part of at least one compensating network associated with said at least one tab at said first flex end, and at least part of said at least one compensating network associated with said rest of said flexible tab-board adapter associated with said second flex end; and
  (d) a flexible transmission line extension associated with said at least one transmission path, and further comprising a module-extension connector, said module-extension connector having a first component associated with said flexible tab-board adapter and a second component associated with said flexible transmission line extension, the first component and second component of said module-extension connector being engageable and disengageable.

\* \* \* \* \*